(12) United States Patent
Saito

(10) Patent No.: US 8,767,443 B2
(45) Date of Patent: Jul. 1, 2014

(54) SEMICONDUCTOR MEMORY DEVICE AND METHOD FOR INSPECTING THE SAME

(75) Inventor: Toshihiko Saito, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 322 days.

(21) Appl. No.: 13/235,967

(22) Filed: Sep. 19, 2011

(65) Prior Publication Data

US 2012/0069634 A1 Mar. 22, 2012

(30) Foreign Application Priority Data

Sep. 22, 2010 (JP) ................................ 2010-212179

(51) Int. Cl.
*G11C 11/24* (2006.01)
(52) U.S. Cl.
USPC .................. 365/149; 365/72; 365/210.12
(58) Field of Classification Search
USPC ....................................... 365/149, 210.12, 72
See application file for complete search history.

(56) References Cited

U.S. PATENT DOCUMENTS

| | | | |
|---|---|---|---|
| 4,466,081 A | 8/1984 | Masuoka | |
| 5,731,856 A | 3/1998 | Kim et al. | |
| 5,744,864 A | 4/1998 | Cillessen et al. | |
| 6,127,702 A | 10/2000 | Yamazaki et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |

(Continued)

FOREIGN PATENT DOCUMENTS

EP 0 053 878 B1 6/1982
EP 1 737 044 A1 12/2006

(Continued)

OTHER PUBLICATIONS

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; vol. 51; No. 11; pp. 1805-1810.

(Continued)

*Primary Examiner* — Toan Le
(74) *Attorney, Agent, or Firm* — Fish & Richardson P.C.

(57) ABSTRACT

When the threshold voltage $V_{th}$ of the transistor in the memory cell is within the allowable range is determined, a memory cell which does not have sufficient data retention characteristics is eliminated. In order to eliminate such a memory cell, the potential of a gate of the transistor is kept at an appropriate potential $V_{GM}$ and the potential of a drain of the transistor is set higher than or equal to $V_{GM}$. When data is written to the memory cell in this state, the potential of a source of the transistor is expressed as a formula including the threshold voltage $V_{th}$, ($V_{GM}-V_{th}$). By comparison between the level of the potential and the level of a reference potential, whether the threshold voltage $V_{th}$ is within the allowable range can be determined.

21 Claims, 10 Drawing Sheets

(56) References Cited

U.S. PATENT DOCUMENTS

| | | |
|---|---|---|
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199879 A1 | 9/2005 | Hoffman et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Covan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0285325 A1* | 11/2008 | Kameshiro et al. ............ 365/51 |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0284278 A1* | 11/2009 | Hata et al. .................... 324/763 |
| 2010/0065844 A1 | 3/2010 | Tokunaga |
| 2010/0092800 A1 | 4/2010 | Itagaki et al. |
| 2010/0103156 A1* | 4/2010 | Yamashita et al. ............ 345/211 |
| 2010/0109002 A1 | 5/2010 | Itagaki et al. |
| 2010/0148171 A1 | 6/2010 | Hayashi et al. |
| 2011/0063891 A1* | 3/2011 | Kajigaya ........................ 365/149 |
| 2011/0089419 A1 | 4/2011 | Yamazaki et al. |
| 2011/0101351 A1 | 5/2011 | Yamazaki |
| 2011/0186837 A1 | 8/2011 | Takahashi et al. |
| 2011/0194332 A1 | 8/2011 | Saito |
| 2011/0199807 A1 | 8/2011 | Saito et al. |

FOREIGN PATENT DOCUMENTS

| | | |
|---|---|---|
| EP | 2 226 847 A2 | 9/2010 |
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08077785 A | 3/1996 |
| JP | 08-264794 A | 10/1996 |
| JP | 11-505377 A | 5/1999 |
| JP | 2000-044236 A | 2/2000 |
| JP | 2000057783 A | 2/2000 |
| JP | 2000-150900 A | 5/2000 |
| JP | 2000173300 A | 6/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |

OTHER PUBLICATIONS

Wonchan Kim et al.; "An Experimental High-Density DRAM Cell with a Built-in Gain Stage"; IEEE Journal of Solid-State Circuits; Aug. 1, 1994; vol. 29, No. 8; pp. 978-981.

Shoji Shukuri et al.; "A Complementary Gain Cell Technology for Sub-1 V Supply DRAMs"; IEDM 92: Technical Digest of International Electron Devices Meeting; Dec. 13, 1992; pp. 1006-1008.

Shoji Shukuri et al.; "A Semi-Static Complementary Gain Cell Technology for Sub-1 V Supply DRAM's"; IEEE Transactions on Electron Devices; Jun. 1, 1994; vol. 41, No. 6; pp. 926-931.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP" Zeitschrift fur Kristallographie, 2005, vol. 220, pp. 567-570.

(56) References Cited

OTHER PUBLICATIONS

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure For Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistor (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "SPINEL,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] At Temperatures over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest(15-Inch) XGA AMLCD Panel Using IgZo Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432 pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

(56) References Cited

OTHER PUBLICATIONS

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In-Ga-Zn-Oxide TFTS With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):aZn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No, 5, pp. 1012-1015.

* cited by examiner $V_{DH} \geqq V_{GM} > V_{th} > V_{DL}$

SEMICONDUCTOR MEMORY DEVICE AND METHOD FOR INSPECTING THE SAME

BACKGROUND OF THE INVENTION

1. Field of the Invention

The present invention relates to a memory device including a semiconductor.

2. Description of the Related Art

There are many kinds of memory devices including semiconductors. For example, a dynamic random access memory (DRAM), a static random access memory (SRAM), an electrically erasable programmable read-only memory (EEPROM), a flash memory, and the like can be given.

A DRAM stores data by holding electrical charge in a capacitor provided in a memory cell. However, at present, in a commercially available DRAM, even when a transistor used for switching is off, slight leakage current that is nonnegligible is generated between a source and a drain; thus, data is lost in a comparatively short time. Thus, it is necessary to rewrite (refresh) data at a constant frequency (generally every several tens of milliseconds).

An SRAM retains data by utilizing a bistable state of a flip-flop circuit. A CMOS inverter is generally used in a flip-flop circuit of an SRAM; however, six transistors are used in one memory cell and the integration degree of the SRAM is lower than that of a DRAM. In addition, the data is lost when power is not supplied.

On the other hand, in an EEPROM or a flash memory, a so-called floating gate is provided between a channel and a gate and electrical charge is stored in the floating gate, so that data is retained. In this specification, a memory having a floating gate, such as an EEPROM and a flash memory, is particularly called a floating gate nonvolatile memory (FGNVM). The electrical charge stored in the floating gate is held even after the supply of power to a transistor stops; thus, such a memory is called a nonvolatile memory. For example, Reference 1 may be referred to for a flash memory.

Since multilevel data can be stored in one memory cell in an FGNVM, storage capacity can be increased. Further, since the number of contact holes can be markedly decreased in a NAND flash memory, the integration degree can be increased to some extent.

However, an FGNVM needs high voltage at the time of injection of electrical charge to a floating gate or removal of the electrical charge. Thus, deterioration of a gate insulating film cannot be avoided and it is impossible to repeat write and erase operations without limitation.

REFERENCE

Reference 1: Japanese Published Patent Application No. 57-105889
Reference 2: United States Patent Application Publication No. 2005/0199879
Reference 3: United States Patent Application Publication No. 2007/0194379
Reference 4: United States Patent Application Publication No. 2011/0101351

SUMMARY OF THE INVENTION

As described above, a conventional semiconductor memory device has advantages and disadvantages and does not meet all the requirements for practical use. There are some characteristics required for a semiconductor memory device, such as low power consumption, the number of times of rewriting of data, and the like. When the power consumption is high, the size of a device for supplying power needs to be made larger, or an operating time with a battery is shortened. In addition, a semiconductor element might generate heat; thus, the characteristics of the element might deteriorate, and in some cases, a circuit is damaged. Further, it is preferable that the frequency of rewrite of data in a semiconductor memory device does not have limitations and that data can be rewritten one billion times or more.

A conventional DRAM has a problem with power consumption because of its high leakage current due to the use of a silicon semiconductor and refresh operations performed several tens of times per second. On the other hand, an SRAM has a problem in that the integration degree cannot be increased because six transistors are included in one memory cell. Further, an FGNVM does not have a problem with power consumption but has a limited number of times of rewriting of data of a hundred thousand times or less.

It is an object of the present invention to provide a highly-reliable semiconductor memory device that stores data surely for a long period and a method for inspecting such a semiconductor memory device.

It is an object of the present invention to provide a novel semiconductor device (particularly, a semiconductor memory device). It is an object of the present invention to provide a novel method for inspecting a semiconductor device (particularly, a method for inspecting a semiconductor memory device). It is an object of the present invention to provide a novel method for manufacturing a semiconductor device (particularly, a method for manufacturing a semiconductor memory device). It is an object of the present invention to provide a novel method for driving a semiconductor device (particularly, a method for driving a semiconductor memory device). The present invention achieves at least one of the above objects.

The present invention will be described below; terms used in this specification are briefly described. A source and a drain of a transistor have the same or substantially the same structure and function. Even when the structures are different, in this specification, when one of a source and a drain of a transistor is called a source, the other is called a drain for convenience, and they are not particularly distinguished from each other for the reason that a potential applied to the source or the drain or the polarity of the potential is not constant. Thus, a source in this specification can be read as a drain.

Further, even when the expression "connect" is used in this specification, in an actual circuit, there is a case in which no physical connection is made and a wiring is just extended. For example, one wiring functions as gates of a plurality of transistors in some cases. In that case, one wiring might have a plurality of branches to gates in a circuit diagram. Even in such a case, the expression "a wiring is connected to a gate" might be used in this specification.

One embodiment of the present invention is a method for inspecting a semiconductor memory device that includes a plurality of memory cells each including at least one capacitor and a transistor whose source is connected to the capacitor. The method includes a first step of accumulating electrical charge in the capacitor of the memory cell while the potential of a gate of the transistor is a first potential that is higher than or equal to the threshold voltage and the potential of a drain of the transistor is kept higher than or equal to the first potential, and a second step of measuring the potential of the source of the transistor after the first step.

One embodiment of the present invention is a semiconductor memory device that includes a plurality of memory cells each including at least one capacitor and a transistor whose source is connected to the capacitor. The semiconductor memory device includes a portion (e.g., a pad) for supplying a given potential from the outside so that the potential of a gate of the transistor is the given potential that is higher than or equal to the threshold voltage of the transistor.

In the semiconductor memory device, it is preferable that the drain of the transistor be connected to a wiring (e.g., a bit line) to which a data signal is transmitted and that the gate of the transistor be connected to a wiring (e.g., a word line) to which a row selection signal is transmitted.

In addition, in the semiconductor memory device, the transistor may be an n-channel transistor. When the potential of the gate of the transistor is made to have an appropriate level, resistance between the source and the drain (hereinafter referred to as off-state resistance) is preferably higher than or equal to $1 \times 10^{18} \Omega$, more preferably higher than or equal to $1 \times 10^{24} \Omega$. Alternatively, when the potential of the gate is made to have an appropriate level, current flowing between the source and the drain (hereinafter referred to as off-state current) is preferably lower than or equal to $1 \times 10^{-18}$ A, more preferably lower than or equal to $1 \times 10^{-24}$ A.

The memory cell may further include one or more transistors (element transistors), and the source of the transistor that is connected to the capacitor may be connected to a gate of the element transistor.

In the semiconductor memory device, the memory cell in which the potential of the source of the transistor is determined to be out of the specified limits in the second step may be replaced with an auxiliary memory cell.

At least one of the element transistors is preferably formed using a single crystal semiconductor. As the single crystal semiconductor, a known material such as single crystal silicon, single crystal germanium, single crystal silicon germanium, or single crystal gallium arsenide can be used.

A wide-gap oxide semiconductor that has been found in recent years (see References 2 and 3) has extremely small carries caused by thermal excitation. Thus, when the concentration of a donor or an acceptor (in this specification, the concentration of an ionized element that can serve as a donor or an acceptor, i.e., the carrier concentration resulted from a donor or acceptor) is lowered as much as possible, for example, lowered to lower than or equal to $1 \times 10^{14}$ cm$^{-3}$, it is possible to obtain high off-state resistance that is not conceivable with a conventional silicon semiconductor or to obtain low off-state current that is not conceivable with a conventional silicon semiconductor.

When a transistor formed using such a semiconductor and a capacitor are combined with each other and a circuit is formed in which the transistor is used as a switching element and electrical charge is accumulated in the capacitor, for example, the electrical charge can be held for a long period of ten years or more (see Reference 4).

For example, in the case where a circuit is formed using a transistor whose off-state resistance is $1 \times 10^{24} \Omega$ and a capacitor whose capacitance is $1 \times 10^{-15}$ F, the time constant of the circuit is $1 \times 10^9$ seconds, i.e., about 32 years. This means that it takes 32 years to decrease the electrical charge accumulated in the capacitor to about 37% of the initial amount and that about 73% of the initial amount is accumulated even after ten years.

As a memory cell utilizing the accumulation of electrical charge, there is a memory cell including any of circuits illustrated in FIGS. 1A to 1C. A memory cell 100 illustrated in FIG. 1A includes a transistor 101 and a capacitor 102. The transistor whose off-state resistance is extremely high is used as the transistor 101. A portion where a source of the transistor 101 and one electrode of the capacitor 102 are connected to each other is hereinafter referred to as a hold node D.

The operation of the memory cell 100 is similar to the operation of a conventional DRAM. The potential of a gate of the transistor 101 is made to have an appropriate level so that the transistor 101 is turned on, and a potential based on data written is applied to a terminal A so that electrical charge based on the data is accumulated in the capacitor 102. After that, the potential of the gate is made to have an appropriate level so that the transistor 101 is turned off, and electrical charge is stored. When the data is read, the transistor 101 is turned on and a change in potential of the terminal A due to the electrical charge flowing from the capacitor 102 is detected; thus, the data stored can be read.

As is clear from the above description, electrical charge accumulated in the capacitor 102 flows when data is read; thus, the data is lost by reading of the data. Thus, it is necessary to write data after the data is read. Note that electrical charge in the capacitor 102 can be held for an extremely long period unless data is read; unlike a known DRAM, it is not necessary to perform any so-called refresh operation or it is possible to markedly decrease the frequency of the refresh operation.

A memory cell 200N illustrated in FIG. 1B includes a write transistor 201, a capacitor 202, and an n-channel element transistor 203N. The transistor whose off-state resistance is extremely high is used as the write transistor 201. The write transistor 201 corresponds to the transistor 101 in the memory cell 100 illustrated in FIG. 1A. A portion where a source of the write transistor 201, a gate of the element transistor 203N, and one electrode of the capacitor 202 are connected to each other is hereinafter referred to as the hold node D.

Data writing and data retention in the memory cell 200N are the same as those in the memory cell 100. Since the potential of the gate of the element transistor 203N varies depending on data written, data is read by detecting whether the element transistor 203N is on or off after the potentials of terminals C, E, and F are made to have appropriate levels.

As is clear from the above description, electrical charge accumulated in the capacitor 202 does not flow when data is read; thus, the data is retained after the data is read.

A memory cell 200P illustrated in FIG. 1C includes the write transistor 201, the capacitor 202, and a p-channel element transistor 203P. The transistor whose off-state resistance is extremely high is used as the write transistor 201. The memory cell 200P illustrated in FIG. 1C differs from the memory cell 200N illustrated in FIG. 1B in that a p-channel transistor is used as the element transistor.

When a memory device is manufactured using such a memory cell, data can be retained for an extremely long period and power consumption for data retention can be sufficiently reduced.

However, in the case where transistors or capacitors are actually formed, not all the transistors or capacitors have the above characteristics. The resistance of the transistor at the time of retaining data might be $1/10$ of the normal resistance; the resistance of the transistor at the time of writing data might be high (on-state current might be low); or it might be impossible to accumulate an adequate amount of electrical charge in the capacitor because the size of the capacitor or the thickness of a dielectric is different from the normal size or the normal thickness. If the transistor or the capacitor has a problem, it is necessary to find the problem in an early stage.

In the case where the transistor or the capacitor obviously does not operate, it is possible to find the problem in an extremely short time. However, in the case where a period during which electrical charge is held is $1/10$ of the normal period for some of the above reasons, it is not easy to find the problem. This is because it takes at least one year or more to reveal such a problem.

Actually, it is necessary that inspection of a semiconductor device be finished without taking much time after the manufacture of the semiconductor device. If it takes several months to inspect a semiconductor device after the manufacture, manufacturing cost markedly increases. If such a semiconductor device is shipped without elimination of such a defect, the semiconductor device has a problem in that some pieces of data will be lost after the data is retained for ten years. In other words, the reliability as a semiconductor memory device is lowered. There are not effective countermeasures against such a problem conventionally.

A relationship (an $I_D$-$V_G$ curve) between a gate potential $V_G$ and drain current $I_D$ of an n-channel transistor formed using a wide-gap oxide semiconductor is as shown in FIG. 2A. Actually, since it is difficult to measure a current value of $1 \times 10^{-13}$ A or less, the relationships shown in FIGS. 2A and 2B show calculation results simply.

Note that in the case of a p-channel transistor, it is readily appreciated by those skilled in the art that characteristics appear symmetrically on vertical axes in FIGS. 2A and 2B. Although only an n-channel transistor is described below, the same can be applied to a p-channel transistor.

For example, when the potential of a gate is $V_{GL}$, drain current is $1 \times 10^{-24}$ A; when the potential of the gate is $V_{GH}$, the drain current is $1 \times 10^{-5}$ A. Thus, the potential of the gate may be $V_{GH}$ in order that a transistor be turned on and that electrical charge be accumulated in a capacitor, and the potential of the gate may be $V_{GL}$ in order that insulation properties of the transistor be improved and that electrical charge in the capacitor be held.

The threshold voltage $V_{th}$ is a value showing the characteristics of the transistor, and $V_{GH}$ is higher than the threshold voltage. In a region where the potential of the gate is lower than the threshold voltage (a portion denoted by A in FIG. 2A), drain current drastically decreases. This slope is one of the characteristics of the transistor and is referred to as a subthreshold swing (an S value). The slope is defined as the amount of decrease in potential of the gate that is necessary to decrease drain current by one digit.

In particular, in a transistor including a filmy oxide semiconductor in which the amount of donor or acceptor is too small to detect, a value that is very close to the physical lower limit (59 mV/decade at room temperature) is obtained. For example, if the subthreshold swing is 0.1 V/decade, the drain current decuples and resistance between a source and a drain is 1/10 when the potential of the gate is made higher than $V_{GL}$ by 0.1 V. This means that the length of a period during which electrical charge is held is 1/10.

This means that when the threshold voltage of the transistor fluctuates by 0.1 V, retention capability decuples or is 1/10. FIG. 2B shows the characteristics of a first transistor T1 (a solid line) and the characteristics of a second transistor T2 (a dotted line). The transistors have slightly different threshold voltages; thus, drain current in the gate potential $V_{GL}$ is varied by two digits.

Since a slight difference in threshold voltage leads to a big difference in data retention capability, it is necessary to determine a slight difference in threshold voltage of a transistor. In a semiconductor memory device where a great number of memory cells are arranged in matrix, an idea is needed because it is not realistic to measure the threshold voltages of transistors separately.

When the accurate value of the threshold voltage of the transistor is not clear, the gate is made to have a potential that is assumed to be higher than or equal to the threshold voltage. In addition, when the drain is made to have a potential that is higher than or equal to such an assumed potential, the potential of the hold node D is stabilized at a potential obtained by subtraction of the threshold voltage of the transistor from the potential of the gate.

Thus, when the potential of the gate can be controlled precisely and the potential of the hold node D can be measured accurately, the threshold voltage of the transistor can be known accurately. Whether the potential of the hold node D is higher than or equal to a certain value or lower than the certain value can be determined with considerable accuracy. For example, when the potential of the gate is $V_1$ and the potential of the terminal A is higher than $V_1$, if the measured potential of the hold node D is higher than or equal to $V_0$, the threshold voltage can be determined to be higher than or equal to $(V_1 - V_0)$.

In this manner, whether the threshold voltage in the memory cell in the semiconductor memory device is within the specified limits can be determined efficiently. When a memory cell which is out of the specified limits is, for example, replaced with an auxiliary memory cell so as not to be used, the reliability of the semiconductor memory device can be increased.

By employing any of the embodiments, at least one of the objects can be achieved. Note that the semiconductor memory device in the embodiment does not require high voltage which is needed for an FGNVM to write and erase data and does not have a limitation on the frequency of rewrite of data.

The embodiments include a novel semiconductor device (particularly, a novel semiconductor memory device) according to an unprecedented technical idea and a novel method for inspecting a semiconductor device (particularly, a novel method for inspecting a semiconductor memory device) according to an unprecedented technical idea. These embodiments have features such as power saving and a high integration degree.

Each of the embodiments produces at least one of the effects. Needless to say, each of the embodiments does not have to produce all the effects. In addition, an embodiment disclosed in the present invention should not be construed as being limited to the embodiments, and a variety of embodiments of the present invention are disclosed in the following embodiments. These embodiments achieve at least one of the objects.

DETAILED DESCRIPTION OF THE INVENTION

Figure 1A:
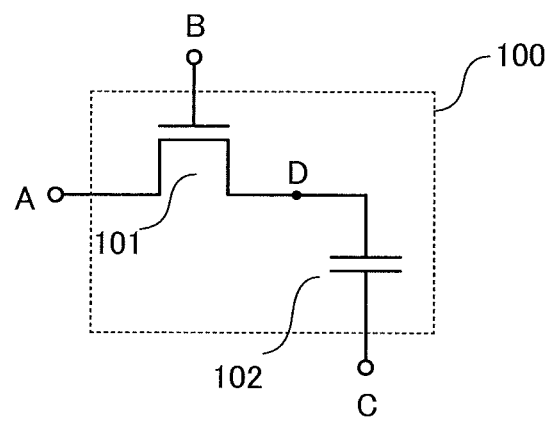
FIGS. 1A to 1C each illustrate an example of a semiconductor memory cell.

Embodiments will be described below with reference to the drawings. Note that the embodiments can be implemented in various different ways. It will be readily appreciated by those skilled in the art that modes and details of the embodiments can be modified in various ways without departing from the spirit and scope of the present invention. The present invention therefore should not be construed as being limited to the following description of the embodiments.

The structures, the conditions, and the like disclosed in any of the following embodiments can be combined with those disclosed in the other embodiment as appropriate. Note that in structures described below, the same portions or portions having similar functions are denoted by the same reference numerals in different drawings, and detailed description of such portions is not repeated in some cases. Note that in the following reference numeral, in the case where a number or a character is described following the under bar (_) of the reference numeral (e.g., "word line $104\_n$"), the number or the character indicates a row or a column.

Note that the position, size, range, or the like of each component illustrated in drawings and the like is not accurately represented in some cases for easy understanding. The disclosed invention is therefore not necessarily limited to the position, size, range, or the like disclosed in the drawings and the like. Further, in this specification and the like, terms such as "first", "second", and "third" are used in order to avoid confusion among components and do not limit the number of components.

Embodiment 1

In this embodiment, a method for inspecting the threshold voltage of the transistor 101 in the memory cell 100 illustrated in FIG. 1A is described. Before the description, a semiconductor memory device including the memory cell 100 is briefly described.

Figure 6:
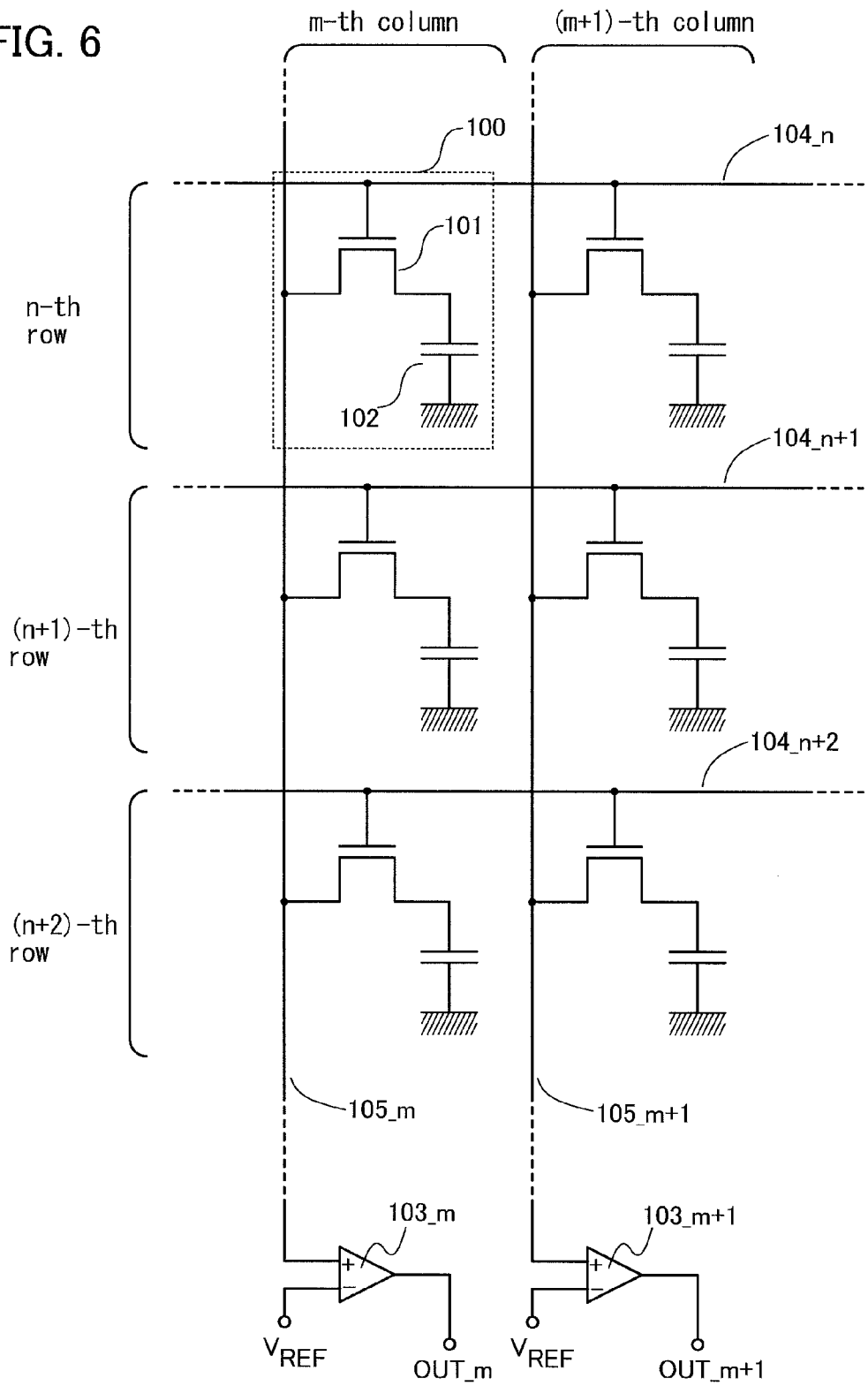
FIG. 6 illustrates an example of a semiconductor memory device.

FIG. 6 illustrates a semiconductor memory device in which the memory cells 100 are arranged in matrix. Here, in the semiconductor memory device, only six memory cells in an n-th row and an m-th column to an (n+2)th row and an (m+1)th column are illustrated. Each memory cell 100 includes the transistor 101 and the capacitor 102, as illustrated in FIG. 1A. The gates (corresponding to a terminal B in FIG. 1A) of the transistors 101 in the rows are connected to the word line $104\_n$, and word lines $104\_n+1$ and $104\_n+2$. Drains (corresponding to the terminal A in FIG. 1A) of the transistors 101 in the columns are connected to bit lines $105\_m$ and $105\_m+1$. Ends of the bit lines $105\_m$ and $105\_m+1$ are connected to one input terminal of a sense amplifier $103\_m$ and one input terminal of a sense amplifier $103\_m+1$, respectively. A reference potential $V_{REF}$ is input to the other input terminal of the sense amplifier $103\_m$ and the other input terminal of the sense amplifier $103\_m+1$. Outputs OUT_m and OUT_m+1 from the sense amplifiers are data read.

In order to prevent a data reading error, it is necessary that the capacitance of the capacitor 102 be higher than the capacitance (including parasitic capacitance) of the bit line $105\_m$ or $105\_m+1$ to some extent. The capacitance of the capacitor 102 is preferably higher than or equal to $1 \times 10^{-15}$ F.

Figure 2A:
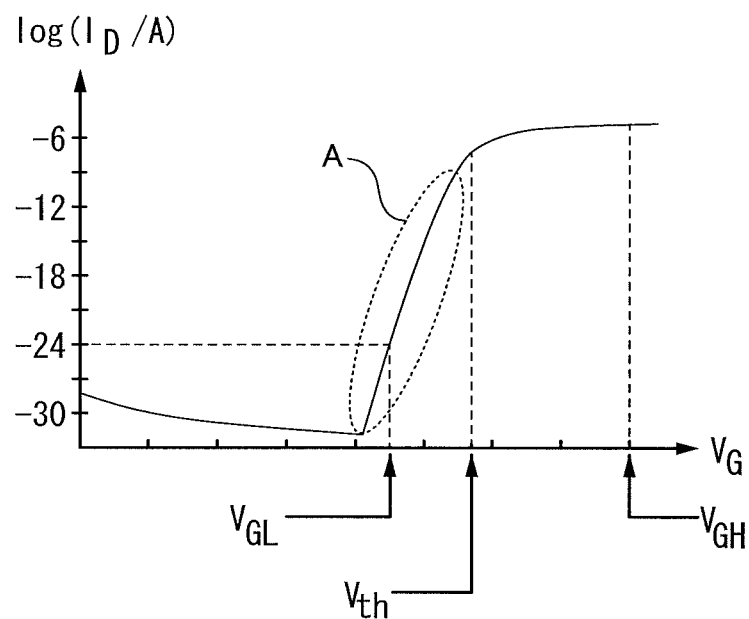
FIGS. 2A and 2B show characteristics of transistors.
Figure 2B:
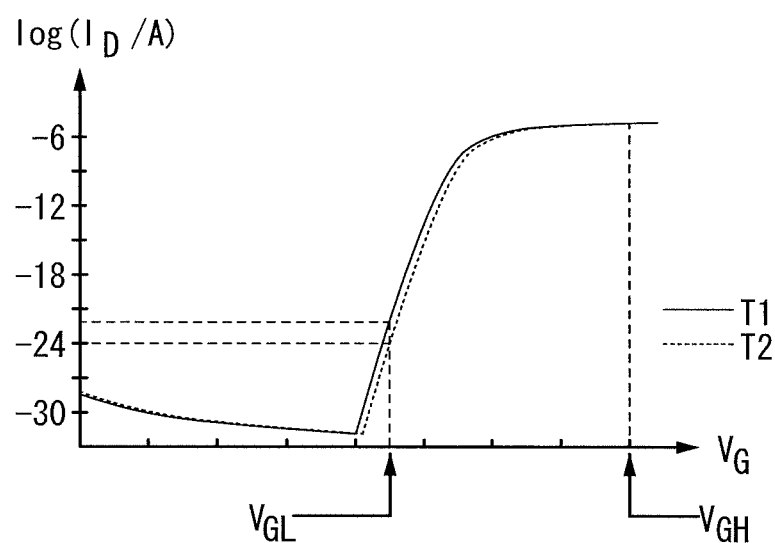

As the transistor 101, it is preferable to use a transistor whose drain current $I_D$ is lower than or equal to $1 \times 10^{-18}$ A, preferably lower than or equal to $1 \times 10^{-21}$ A, more preferably lower than or equal to $1 \times 10^{-24}$ A when the terminal B (the gate of the transistor 101) has the appropriate potential $V_{GL}$. For example, a transistor having characteristics illustrated in FIG. 2A is preferably used.

Such a transistor can be obtained by using, for example, a material with a donor or acceptor concentration of lower than or equal to $1 \times 10^{14}$ cm$^{-3}$, preferably lower than or equal to $1 \times 10^{11}$ cm$^{-3}$, and a band gap of more than or equal to 2.5 eV, preferably more than or equal to 3.0 eV and less than or equal to 4.0 eV.

As such a material, an oxide containing at least one of indium (In) and zinc (Zn) is preferable. In particular, an oxide containing In and Zn is preferable. As a stabilizer for reducing variations in electrical characteristics of a transistor formed using the oxide, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an In—Ga—Zn-based oxide means an oxide containing In, Ga, and Zn as main components, and there is no limitation on the ratio of In, Ga, and Zn. In addition, the In—Ga—Zn—O-based oxide may contain a metal element other than In, Ga, and Zn.

Alternatively, a material represented by InMO$_3$(ZnO)$_m$ (m>0, where m is not an integer) may be used as an oxide semiconductor. Note that M represents one or more metal elements selected from Ga, Fe, Mn, or Co. As the oxide semiconductor, a material represented by In$_2$SnO$_5$(ZnO)$_n$ (n>0, where n is an integer) may be used.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide whose composition is in the neighborhood of the above composition can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/

2), or In:Sn:Zn=2:1:5 (=1/4:1/8:5/8), or an oxide whose composition is in the neighborhood of the above composition is preferably used.

However, without limitation to the materials given above, a material with an appropriate composition may be used in accordance with needed semiconductor characteristics (e.g., mobility, threshold voltage, and variation). In order to obtain needed semiconductor characteristics, it is preferable that carrier concentration, impurity concentration, defect density, an atomic ratio between a metal element and oxygen, interatomic distance, density, and the like be set to appropriate values.

For example, with the In—Sn—Zn-based oxide, high mobility can be comparatively easily obtained. However, mobility can be increased by lowering defect density in a bulk also in the case of the In—Ga—Zn-based oxide. Note that for the purpose of forming a practical transistor, a field-effect mobility of higher than or equal to 5 cm$^2$/Vs, preferably higher than or equal to 10 cm$^2$/Vs is needed.

Note that for example, the expression "the composition of an oxide with an atomic ratio of In:Ga:Zn=a:b:c (a+b+c=1) is in the neighborhood of the composition of an oxide with an atomic ratio of In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a crystalline portion or a non-amorphous structure.

An amorphous oxide semiconductor can have a flat surface comparatively easily, so that when a transistor is formed using the oxide semiconductor, interface scattering can be reduced, and comparatively high mobility can be obtained comparatively easily.

In a crystalline oxide semiconductor, defects in a bulk can be further reduced and when surface flatness is improved, mobility which is higher than or equal to the mobility of an amorphous oxide semiconductor can be obtained. In order to improve the surface flatness, the oxide semiconductor is preferably formed over a flat surface. Specifically, the oxide semiconductor may be formed over a surface with an average surface roughness ($R_a$) of less than or equal to 1 nm, preferably less than or equal to 0.3 nm, more preferably less than or equal to 0.1 nm.

Note that $R_a$ is obtained by three-dimensionally expanding centerline average roughness, which is defined by JIS B0601, so as to be applicable to a surface. Further, $R_a$ can be expressed as an average value of the absolute values of deviations from a reference surface to a specific surface.

The memory cell 100 illustrated in FIG. 1A is basically the same as a memory cell in a known DRAM. However, the off-state resistance of the transistor 101 is higher than that of the known DRAM by ten digits or more; thus, data can be retained for a long period, for example, ten years or more.

Note that in order to retain data for a long period as described above, it is necessary that the off-state current of the transistor 101 be sufficiently low (the off-state resistance be sufficiently high) and that leakage current between the gate and the source of the transistor 101 and leakage current between the electrodes of the capacitor 102 be lower than the off-state current of the transistor 101 (resistance between the gate and the source of the transistor 101 and resistance between the electrodes of the capacitor 102 are high).

Data is written (rewritten) in such a manner that the potential of the terminal B is set to a potential (e.g., $V_{GL}$) that is much lower than the threshold voltage while the transistor 101 is turned on by application of a potential (e.g., $V_{GH}$) that is higher than or equal to the threshold voltage to the terminal B and a potential $V_{DH}$ ($\leq V_{GH}$) based on data is applied to the terminal A.

Data is retained while the potential of the terminal B is kept at the potential (e.g., $V_{GL}$) that is much lower than the threshold voltage. For example, when the potential of the terminal B is $V_{GL}$, an off-state current that is as low as $1 \times 10^{-24}$ A is obtained if the transistor having the characteristics illustrated in FIG. 2A is used. Thus, electrical charge accumulated in the capacitor 102 can be retained for an extremely long period.

A method for determining whether the threshold voltage of the transistor 101 in the memory cell 100 is within the allowable range (a range in which data is written without any problem and data can be retained for a required period) is described with reference to FIGS. 3A to 3D. Needless to say, in a conventional DRAM, data is retained for shorter than or equal to one second; thus, the following inspection is not performed.

Figure 3A:
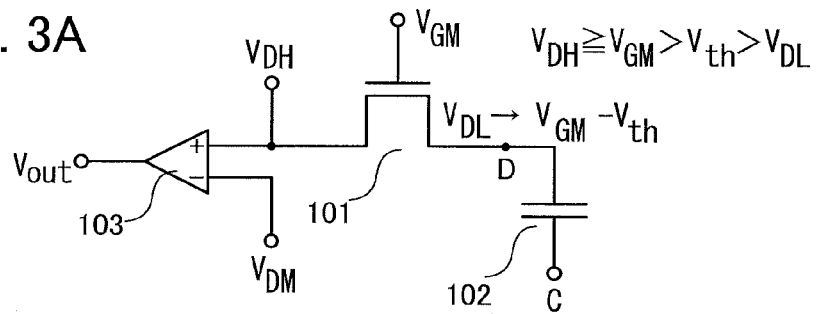
FIGS. 3A to 3D illustrate an example of a method for inspecting a semiconductor memory device.

As illustrated in FIG. 6, the drain (corresponding to the terminal A) of the transistor 101 is connected to one input terminal of a sense amplifier 103 (see FIG. 3A). A reference potential is held in the other input terminal of the sense amplifier 103. Here, the reference potential is $V_{DM}$ (>0). When the potential of the drain of the transistor 101 is higher than or equal to $V_{DM}$, the output $V_{OUT}$ of the sense amplifier 103 is H. When the potential of the drain of the transistor 101 is lower than $V_{DM}$, the output $V_{OUT}$ of the sense amplifier 103 is L.

First, both the potential of the drain of the transistor 101 and the potential of the source of the transistor 101 are $V_{DL}$. Here, $V_{DL}$ is lower than the threshold voltage $V_{th}$ of the transistor 101. The potential of the terminal C is fixed. Then, electrical charge is accumulated in the capacitor 102. The potential of the drain of the transistor 101 is $V_{DH}$ and the potential of the gate of the transistor 101 is $V_{GM}$. Note that $V_{DH}$ is higher than or equal to $V_{GM}$, and $V_{GM}$ is higher than the threshold voltage $V_{th}$ of the transistor 101. Then, the transistor 101 is turned on, so that electrical charge is accumulated in the capacitor 102. The potential of the hold node D rises in accordance with the accumulation of electrical charge and is stabilized at a potential ($V_{GM}-V_{th}$) (see FIG. 3A).

Here, the potential of the gate of the transistor 101 is set to $V_{GL}$, so that the transistor 101 is turned off. In addition, the potential of the drain of the transistor 101 is $V_{DM}$ (see FIG. 3B). After that, the drain of the transistor 101 is set to be in a floating state and the potential of the gate of the transistor 101 is set higher than or equal to $V_{GM}$, so that the transistor 101 is turned on. Then, the electrical charge accumulated in the capacitor moves, so that both the source and the drain of the transistor 101 have the same potential $V_{DX}$ (see FIG. 3C).

Here, when the initial potential ($V_{GM}-V_{th}$) of the source (the hold node D) of the transistor 101 is higher than or equal to $V_{DM}$, the potential $V_{DX}$ is higher than or equal to the potential $V_{DM}$. Thus, the output $V_{OUT}$ of the sense amplifier 103 is H. In contrast, when the initial potential ($V_{GM}-V_{th}$) of the source (the hold node D) of the transistor 101 is lower than $V_{DM}$, the potential $V_{DX}$ is lower than the potential $V_{DM}$. Thus, the output $V_{OUT}$ of the sense amplifier 103 is L. In other words, $V_{OUT}$ is H when $V_{th} \leq V_{GM}-V_{DM}$ is satisfied and $V_{OUT}$ is L when $V_{th} > V_{GM}-V_{DM}$ is satisfied.

Figure 3B:
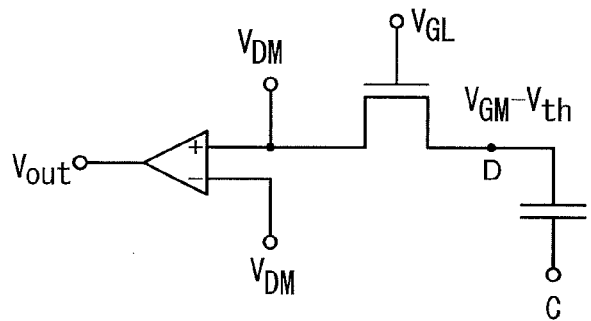

This is described with reference to FIG. 3D. In FIG. 3D, the horizontal axis indicates the potential $V_{GM}$ and the vertical axis indicates the threshold voltage $V_{th}$ of the transistor 101. The output $V_{OUT}$ of the sense amplifier is H on the right side and the lower side of the straight line $V_{th}=V_{GM}-V_{DM}$, and the output $V_{OUT}$ of the sense amplifier is L on the left side and the upper side of the straight line $V_{th}=V_{GM}-V_{DM}$.

Thus, when the potential $V_{GM}$ is set appropriately, whether the threshold voltage $V_{th}$ of the transistor 101 is within an appropriate range (the upper limit is $V_{th\_H}$ and the lower limit is $V_{th\_L}$) can be determined. That is, the following first and second verifications are performed.

In the first verification, whether the threshold voltage $V_{th}$ is lower than or equal to the upper limit of the range is determined under a condition of $V_{GM}=V_{GM\_H}=V_{th\_H}+V_{DM}$. When the output $V_{OUT}$ of the sense amplifier 103 is H, the threshold voltage $V_{th}$ is lower than or equal to the upper limit $V_{th\_H}$. In the second verification, whether $V_{th}$ is higher than the lower limit of the range is determined under a condition of $V_{GM}=V_{GM\_L}=V_{th\_L}+V_{DM}$. When the output $V_{OUT}$ of the sense amplifier 103 is L, the threshold voltage $V_{th}$ is higher than the lower limit $V_{th\_L}$.

In other words, when the output $V_{OUT}$ of the sense amplifier 103 is H in the first verification and the output $V_{OUT}$ of the sense amplifier 103 is L in the second verification, it can be said that the threshold voltage $V_{th}$ of the transistor 101 is between $V_{th\_H}$ and $V_{th\_L}$. In other cases, the threshold voltage $V_{th}$ of the transistor 101 is out of the allowable range.

As a result of these verifications, the memory cell 100 including the transistor 101 whose threshold voltage $V_{th}$ is determined to be between $V_{th\_H}$ and $V_{th\_L}$ is treated as a good item. The memory cell 100 including the transistor 101 whose threshold voltage $V_{th}$ is not determined to be between $V_{th\_H}$ and $V_{th\_L}$ has a problem with data retention characteristics; thus, such a memory cell is not used. It is preferable to replace the memory cell with an auxiliary memory cell.

A specific example is described below. In this example, the allowable range of the threshold voltage $V_{th}$ of the transistor 101 is +1.4<$V_{th}$+2.4 [V]. Note that the allowable range of the threshold voltage can be set as appropriate by a practitioner regardless of the above range.

For example, in the above example, when the potential of the gate of the transistor 101 at the time of writing data is +2.5 V, the potential of the hold node D after data writing is varied by 1 V and the lowest potential is +0.1 V. When multivalued data is written, +0.1 V is insufficient as the potential of the hold node D after data writing, and higher than or equal to +0.8 V might be needed, for example. In such a case, the upper limit of the threshold voltage may be +1.7 V (=2.5 V−0.8 V).

Inspection for determining whether the threshold voltage of the transistor 101 is within the allowable range of the threshold voltage that is set as described above is performed. Note that the potential of the hold node D is set to 0 V before the following verifications.

First, whether the threshold voltage $V_{th}$ of the transistor 101 is lower than or equal to +2.4 V that is the upper limit is determined (first verification). In order to perform the first verification, $V_{GM}$ is set to ($V_{DM}$+2.4) [V]. Then, the potential of the hold node D is stabilized at ($V_{DM}$+2.4−$V_{th}$) [V] when $V_{th}$<$V_{DM}$+2.4 [V] or is stabilized at 0 V when $V_{th}$≥$V_{DM}$+2.4 [V]. When $V_{th}$ is lower than or equal to +2.4 V, the potential of the hold node D is higher than or equal to $V_{DM}$. Thus, the output of the sense amplifier 103 is H. That is, when the output of the sense amplifier 103 is H, $V_{th}$ is lower than or equal to +2.4 V. In contrast, when the output of the sense amplifier 103 is L, $V_{th}$ is higher than +2.4 V. Through the above steps, the first verification is completed. After that, the potential of the hold node D is set to 0 V.

Next, whether the threshold voltage $V_{th}$ of the transistor 101 is higher than +1.4 V that is the lower limit is determined (second verification). In order to perform the second verification, $V_{GM}$ is set to ($V_{DM}$+1.4) [V]. Then, the potential of the hold node D is ($V_{DM}$+1.4−$V_{th}$) [V] when $V_{th}$<$V_{DM}$+1.4 [V] or is 0 V when $V_{th}$≥$V_{DM}$+1.4 [V]. When $V_{th}$ is higher than +1.4 V, the potential of the hold node D is lower than $V_{DM}$. Thus, the output of the sense amplifier 103 is L. That is, when the output of the sense amplifier 103 is L, $V_{th}$ is higher than +1.4 V. In contrast, when the output of the sense amplifier 103 is H, $V_{th}$ is lower than or equal to +1.4 V. Through the above steps, the second verification is completed.

Through the above verifications, it is possible to select memory cells in which the threshold voltages $V_{th}$ of the transistors 101 are within the allowable range. Accordingly, it is possible to prevent a defect in which an adequate amount of electrical charge cannot be accumulated in the capacitor 102 because the threshold voltage $V_{th}$ of the transistor 101 is too high and a defect in which electrical charge cannot be held for a required period because the threshold voltage $V_{th}$ is too low, so that reliability can be improved.

The above method can be applied to a semiconductor memory device where the memory cells 100 are arranged in matrix as follows. First, through initial inspection, memory cells where the transistors 101 operate normally are recorded. The threshold voltages of the transistors 101 in these memory cells are certainly higher than or equal to 0 V; however, the detailed levels of the threshold voltages are not clear. Thus, whether the memory cells have adequate capability of data retention is not clear.

Next, in the semiconductor memory device illustrated in FIG. 6, data is written to all the memory cells in rows that should be inspected as illustrated in FIG. 3A while the potentials of word lines in the rows are the potential $V_{GM}$ that is used in the first verification or the second verification and the potentials of all the bit lines are $V_{DH}$ ($V_{DH}$≥$V_{GM}$). After that, as illustrated in FIG. 3B, the potential of the word line is set to $V_{GL}$ and the potential of the bit line is set to $V_{DM}$.

Figure 3C:
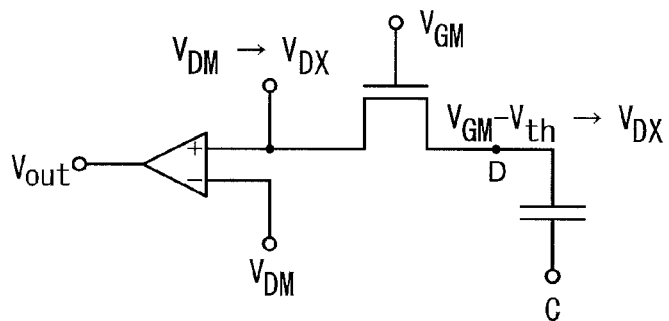
Figure 3D:
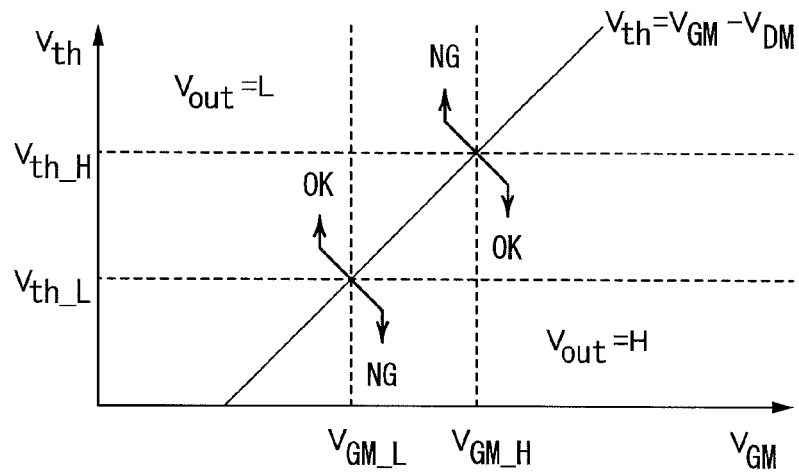

Then, as illustrated in FIG. 3C, when the potential of the word line is set higher than or equal to $V_{GM}$ and the outputs of the sense amplifiers 103 in columns that are connected to the bit lines 105 in the columns in that case are read, whether the threshold voltages $V_{th}$ of the transistors 101 in the memory cells 100 in the row are within the allowable range can be determined After that, inspection of the next row is performed.

As is clear from the above description, it takes an extremely short time to perform inspection, which does not pose an obstacle to production. Note that through the above inspection, it is preferable to replace bad memory cells with auxiliary memory cells.

Note that the potential $V_{GM}$ that is used in the above inspection is needed only at the time of inspection and is not used in normal operation. Thus, it is no use providing a potential generation circuit for the potential $V_{GM}$ in the semiconductor memory device. In addition, it is necessary that the accuracy of the potential be less than or equal to 60 mV, preferably less than or equal to 10 mV. For the above reasons, the potential $V_{GM}$ may be introduced into a word line 104 from the outside. In the case where a potential which has the same level as $V_{GM}$ is employed as $V_{DH}$, the potential $V_{GM}$ introduced from the outside may also be introduced into the bit line.

Figure 9A:
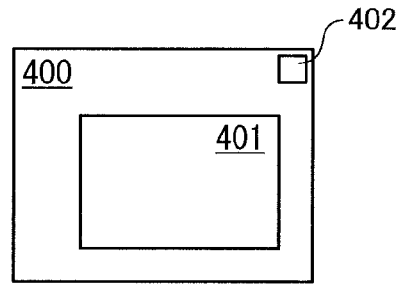
FIGS. 9A and 9B illustrate an example of a semiconductor memory device.

For example, as illustrated in FIG. 9A, a pad 402 for introducing the potential $V_{GM}$ from the outside is provided in a semiconductor memory device having a region where memory cells are arranged in matrix over a chip 400 (hereinafter such a region is referred to as a memory cell array 401).

Figure 9B:
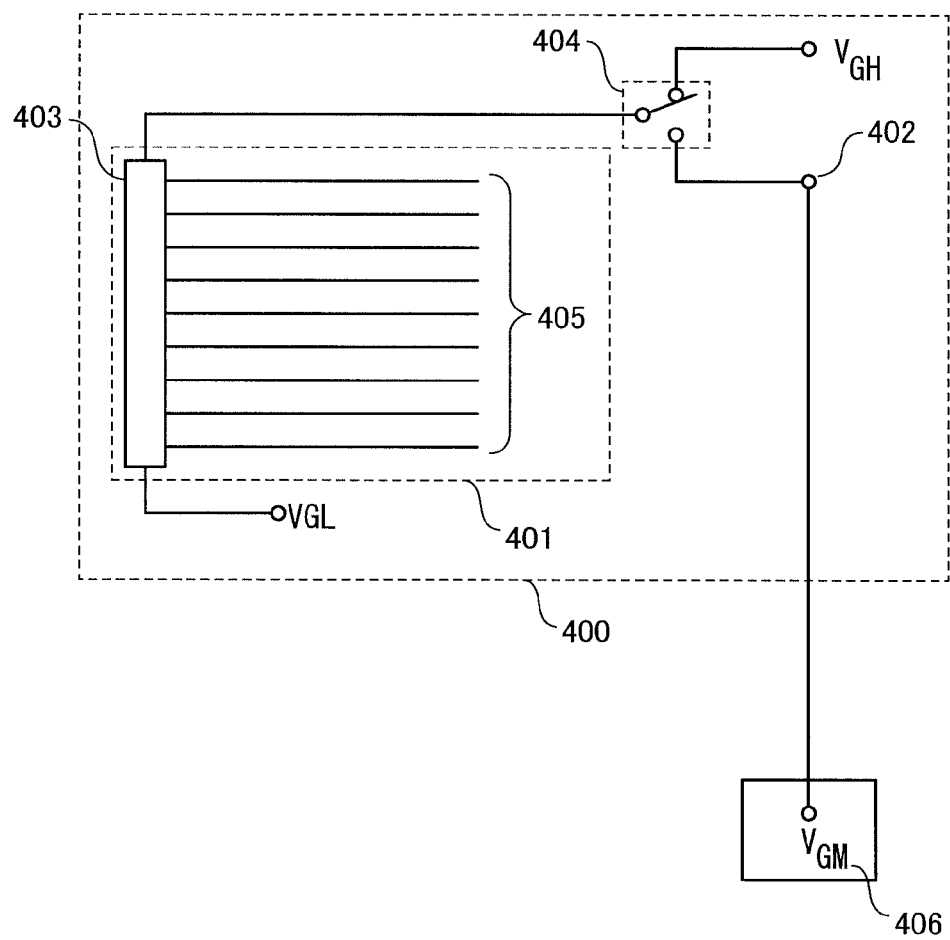

The circuit structure of the semiconductor memory device illustrated in FIG. 9A is as illustrated in FIG. 9B. In other words, the chip 400 has the memory cell array 401, and the memory cell array 401 has a decoder 403 for supplying a potential to a word line 405.

Two potentials of a high potential (a potential for turning on a transistor, usually $V_{GH}$) and a low potential (a potential for turning off a transistor, $V_{GL}$) are applied to the word line; thus, the decoder has two input terminals for application of the potentials. One of the potentials is fixed to the low potential, and the other of the potentials is changed in two or more levels by a switch 404 provided outside the memory cell array 401. Note that the switch 404 is preferably formed using a transistor or the like.

One input of the switch 404 is fixed to the high potential. The other input of the switch 404 is connected to the pad 402. At the time of inspecting the memory cell, the pad 402 is connected to an external power source 406 for supplying the potential $V_{GM}$ through a prober or the like. The accuracy of a potential supplied from the external power source 406 is preferably less than or equal to 10 mV, more preferably less than or equal to 1 mV.

Note that since the potential $V_{DM}$ is the fixed potential, the potential can be made using a power source in the semiconductor memory device. However, since high stability or high accuracy is needed as in the case of the potential $V_{GM}$, the potential $V_{DM}$ may be introduced from the outside as in the case of the potential $V_{GM}$.

Figure 1B:
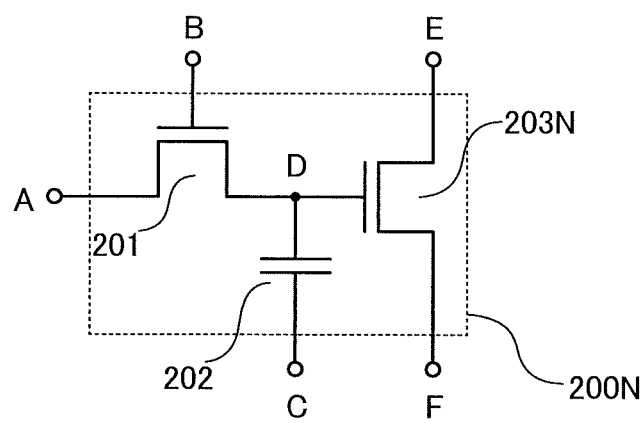
Figure 1C:
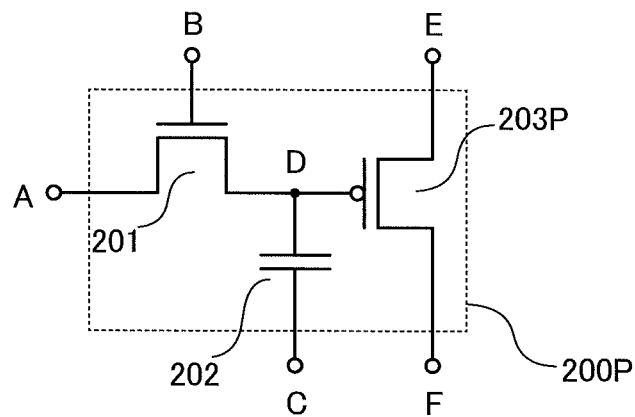

The above method can also be applied to the memory cell 200N illustrated in FIG. 1B or the memory cell 200P illustrated in FIG. 1C. This is because the memory cell 200N or 200P has a structure that is similar to the structure of the memory cell 100 illustrated in FIG. 1A though the memory cell 200N or 200P differs from the memory cell 100 in that it has the element transistor 203N or 203P.

Embodiment 2

In this embodiment, a method for driving the memory cell 200N illustrated in FIG. 1B or the memory cell 200P illustrated in FIG. 1C and a method for inspecting whether the threshold voltage of the write transistor 201 used in the memory cell is within the allowable range are described. Note that as described in Embodiment 1, the threshold voltage of the write transistor 201 used in the memory cell 200N or 200P can also be inspected by the method described in Embodiment 1. In this embodiment, an inspection method that is different from the method described in Embodiment 1 is described.

First, the structure, operation, feature, and the like of the memory cell 200N illustrated in FIG. 1B are described. As described above, the memory cell 200N includes the write transistor 201, the capacitor 202, and the element transistor 203N.

The write transistor 201 is formed using an oxide semiconductor or the like and has sufficiently high off-state resistance. In addition, it is preferable to use a single crystal semiconductor with high mobility for the element transistor 203N because the reading speed increases with the use of a semiconductor with high mobility, though the single crystal semiconductor does not directly influence storage of electrical charge. Further, in order to prevent leakage current through a gate insulating film of the element transistor 203N, it is preferable that the gate insulating film of the element transistor 203N have sufficient thickness. However, if the gate insulating film is thick, the decrease in on-state current occurs. In order to prevent this, it is preferable to use a semiconductor with high mobility.

In addition, the capacitance of the capacitor 202 is determined in consideration of the off-state resistance of the write transistor 201 at the time of storing data, and larger capacitance enables data to be stored for a longer period. Note that unlike the memory cell 100 described in Embodiment 1, there is no limitation by the capacitance of a bit line at the time of reading data. Thus, the capacitance of the capacitor 202 can be lower than or equal to $1 \times 10^{-16}$ F, preferably lower than or equal to $1 \times 10^{-17}$ F. When the capacitance of the capacitor 202 is decreased, the time for writing data can be markedly shortened.

It is not necessary to write data after data is read like a DRAM in order that the data is not lost at the time of reading the data, operation is simple, and power consumption can be reduced, which is advantageous.

Note that if the capacitance of the capacitor 202 is so low, the data retention period is shortened. In order to prevent this, it is necessary to increase the off-state resistance of the write transistor 201 in accordance with the decrease in capacitance of the capacitor 202. For example, in the case where the capacitance of the capacitor 202 is $1 \times 10^{-17}$ F, data can be stored for ten years when the off-state resistance of the write transistor 201 is higher than or equal to $1 \times 10^{26} \Omega$.

Figure 4A:
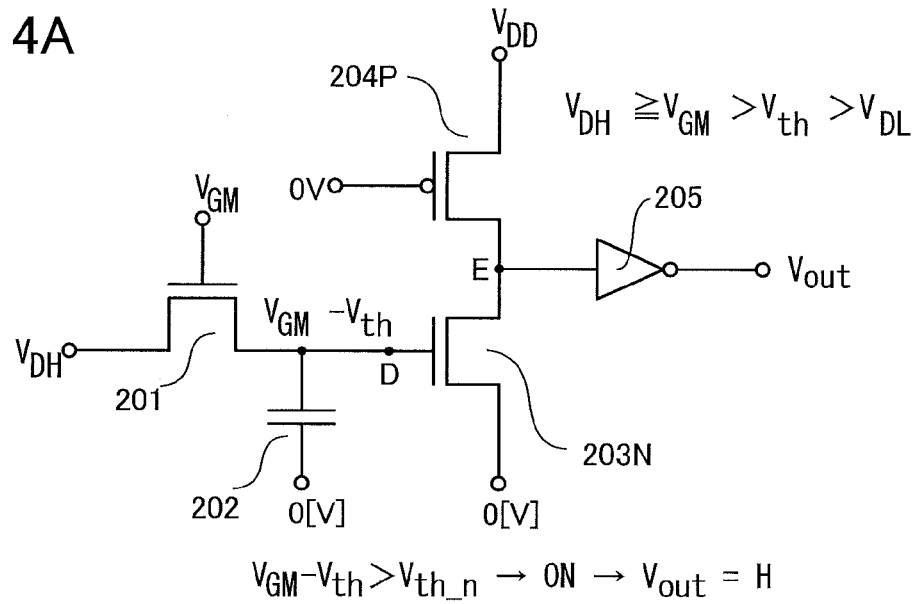
FIGS. 4A and 4B illustrate an example of a method for inspecting a semiconductor memory device.

A p-channel read transistor 204P illustrated in FIG. 4A might be connected to the terminal E of the memory cell 200N in FIG. 1B for reading data. A drain of the read transistor 204P is connected to the terminal E (hereinafter referred to as a node E). At the time of reading data, for example, a ground potential (0 V in the following description) is applied to a gate, and a power supply potential $V_{DD}$ is applied to a source. An inverter 205 is connected to the node E. The data read can be determined by the output $V_{out}$ of the inverter 205.

Note that the read transistor 204P is preferably designed such that the on-state current of the read transistor 204P is lower than the on-state current of the element transistor 203N under the same conditions (e.g., a gate potential and a drain potential) set in consideration of polarity.

A different circuit may be used instead of the inverter 205. For example, a sense amplifier may be used. Embodiment 1 or FIG. 6 may be referred to for the sense amplifier. When the sense amplifier is used, the output of the sense amplifier changes in accordance with the magnitude relation between the potential of the node E and the reference potential $V_{REF}$, which makes it possible to know the data retained in the memory cell.

A method for writing data to the memory cell 200N illustrated in FIG. 1B and a method for retaining data in the memory cell 200N illustrated in FIG. 1B are similar to the method for writing data to the memory cell 100 and the method for retaining data in the memory cell 100 in Embodiment 1. At the time of writing data, the terminals C, E, and F are kept at appropriate potentials. Data is retained as electrical charge accumulated in the capacitor 202.

Data can be rewritten in a manner similar to that of the data writing. Unlike a flash memory, data erase operation is not needed. In a flash memory, data erase operation is needed at the time of rewriting data, and high voltage is used in order to release electrical charge from a floating gate. Thus, operating speed is decreased; however, in a memory cell in this embodiment, similar operation can be performed by on and off of a normal transistor, and high-speed operation can be performed.

Note that when the voltage of the terminal A at the time of writing data is three or more levels, any of three or more kinds of (multivalued) data can be stored. The capability of storing multivalued data in one memory cell provides substantially the same effect as increasing the integration degree.

At the time of reading data, an appropriate potential is applied to the terminal C while the potential of the terminal B is kept at a potential at which the write transistor 201 is turned off. The potential of the hold node D (i.e., the gate of the element transistor 203N) varies depending on data written. In addition, the potential of the hold node D can be controlled by the potential of the terminal C through the capacitor 202. Thus, for example, when data written has two values of H and L, a potential at which the element transistor 203N is turned off in the case of H and the element transistor 203N is turned on in the case of L can be applied to the terminal C. In that case, data written can be known by reading the state of the element transistor 203N.

By application of an appropriate potential to the terminal C, the element transistor 203N can be turned off or on regardless of data written. In the case where data is read from a different memory cell, the potential of the terminal C is set to a potential at which the element transistor 203N is turned on or off regardless of the potential of the hold node D (the data written).

Figure 7:
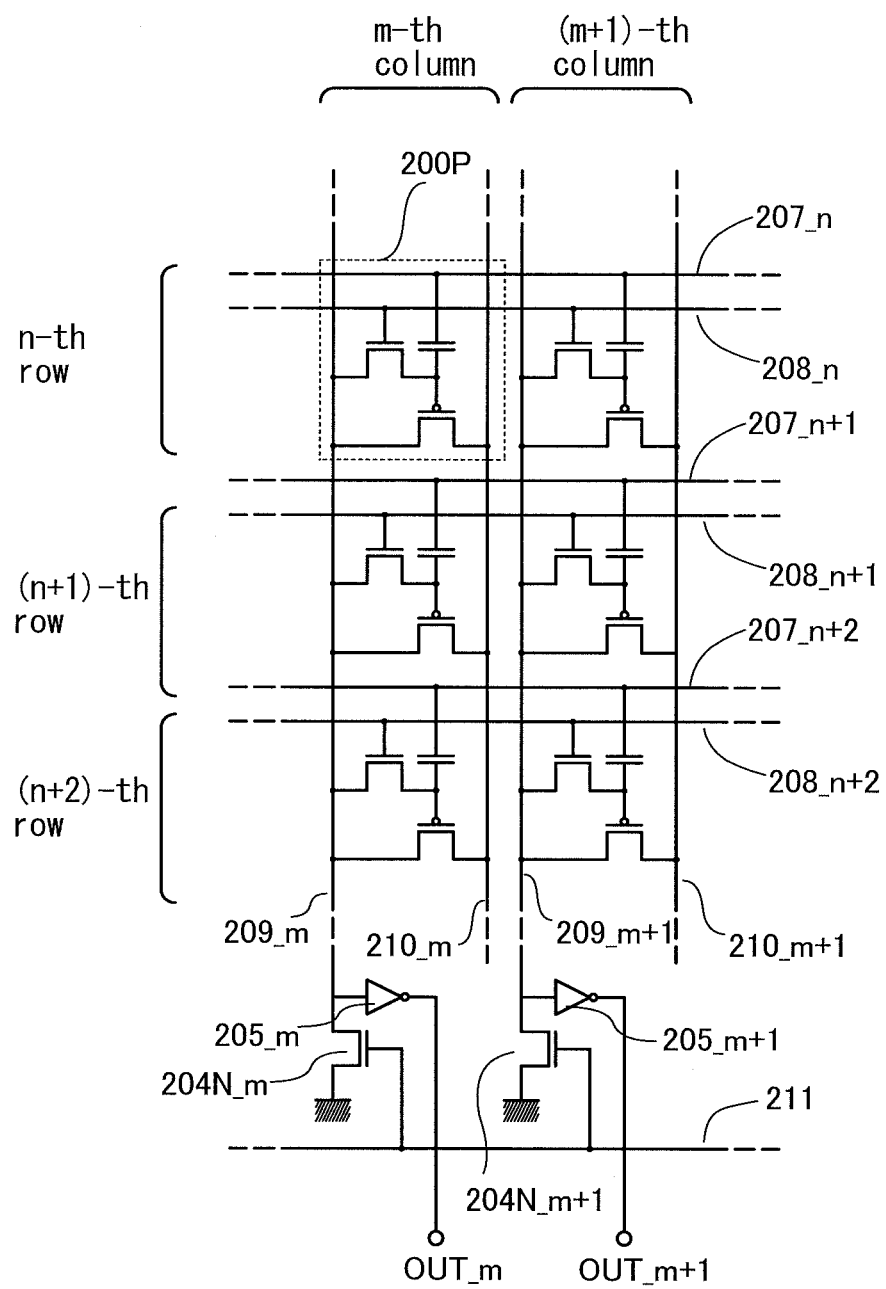
FIG. 7 illustrates an example of a semiconductor memory device.

In order to reduce power consumption, in the case of a NOR memory device illustrated in FIG. 7, the element transistor 203N is preferably off except when data is read from the memory cell. On the other hand, in the case of a NAND memory device illustrated in FIG. 8, it is necessary that all the memory cells except the memory cell in the NAND circuit be on at the time of reading data.

In order to know whether the element transistor 203N is on or off, the potential of the node E in FIG. 4A is measured. Specifically, the potential of the node E is known when the output $V_{out}$ of the inverter 205 is read. When the potential of the node E is higher than $V_{DD}/2$, the output $V_{out}$ of the inverter 205 is 0 V. When the potential of the node E is lower than $V_{DD}/2$, the output $V_{out}$ of the inverter 205 is $V_{DD}$.

As is clear from the above description, data is not lost at the time of reading data. This is similar to an FGNVM such as a flash memory. Current that leaks from the write transistor 201 is extremely low when data is stored (when the write transistor 201 is off); thus, it can be said that the hold node D is buried in an insulator while holding electrical charge. This state corresponds to a floating gate of an FGNVM, and data can be retained for a long period.

In contrast, in the memory cell or the semiconductor memory device in this embodiment, data erase operation is not needed as described above; a problem of deterioration of a gate insulating film by injection and release of electrical charge with the use of high voltage that are essential for an FGNVM does not occur; and there is no limitation on the frequency of rewrite of data in principle.

Note that in order to retain data for a long period as described above, it is necessary that the off-state current of the write transistor 201 be sufficiently low (the off-state resistance be sufficiently high) and that leakage current between a gate and a source of the write transistor 201, leakage current between the gate and a drain of the element transistor 203N, leakage current between the gate and a source of the element transistor 203N, and leakage current between the electrodes of the capacitor 202 be sufficiently low (resistance be sufficiently high).

The memory cell 200P illustrated in FIG. 1C is obtained by replacement of the element transistor 203N in the memory cell 200N illustrated in FIG. 1B with the p-channel element transistor 203P. Thus, the potentials of the terminals C and F are different. Note that a method for writing data and a method for retaining data are the same as those of the memory cell 200N in FIG. 1B.

Figure 5A:
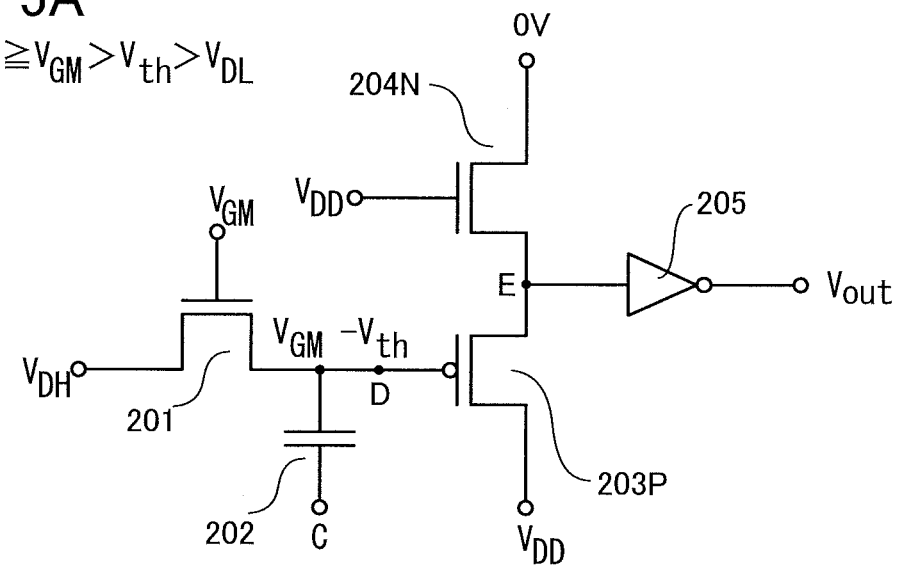
FIGS. 5A to 5C illustrate an example of a method for inspecting a semiconductor memory device.

An n-channel read transistor 204N illustrated in FIG. 5A is connected to the terminal E of the memory cell 200P in FIG. 1C for reading data. A drain of the read transistor 204N is connected to the terminal E. At the time of reading data, for example, the power supply potential $V_{DD}$ is applied to a gate, and 0 V is applied to a source.

Other operations at the time of reading data are similar to those of the memory cell 200N in FIG. 1B, and the state of the element transistor 203P can be known by reading the output $V_{out}$ of the inverter 205. A different circuit may be used instead of the inverter 205. For example, a sense amplifier may be used.

The basic operation of the memory cell 200N illustrated in FIG. 1B and the memory cell 200P illustrated in FIG. 1C is described above. Note that the number of terminals may be reduced by improvement of the memory cell 200N illustrated in FIG. 1B or the memory cell 200P illustrated in FIG. 1C.

An example of a matrix driving of the memory cell 200P illustrated in FIG. 1C is described with reference to FIG. 7. FIG. 7 illustrates part of a semiconductor memory device that corresponds to six memory cells in an n-th row and an m-th column to an (n+2)th row and an (m+1)th column (n and m are natural numbers). These memory cells are the same as the memory cell illustrated in FIG. 1C.

An example of data writing is described below. First, the potentials of all the read word lines (including read word lines 207_n, 207_n+1, and 207_n+2) and the potentials of all the source lines (including source lines 210_m and 210_m+1) are set to 0 V.

In addition, the potential of a read line 211 to which gates of read transistors (including read transistors 204N_m and 204N_m+1) are set to 0 V so that all the read transistors are turned off.

In this state, the potential of a write word line 208_n is set to the potential $V_{GH}$ at which the write transistor is turned on, and the potentials of other write word lines (including write word lines 208_n+1 and 208_n+2) are set to the potential $V_{GL}$ at which the transistor is turned off. Further, signals based on data to be written to the memory cells in the n-th row are supplied to all the bit lines (including the bit lines 209_m and 209_m+1). The signal may be either a binary signal or a multivalued signal. By this operation, only the write transistors in the n-th row are turned on, and data is written to the memory cells in the n-th row.

Next, the potential $V_{GL}$ is applied to all the write word lines except the write word line 208_n+1, and the potential $V_{GH}$ is applied only to the write word line 208_n+1. Further, signals based on data to be written to the memory cells in the (n+1)th row are supplied to all the bit lines (including the bit lines 209_m and 209_m+1). By this operation, data is written to the memory cells in the (n+1)th row.

Then, the potential $V_{GL}$ is applied to all the write word lines except the write word line 208_n+2, and the potential $V_{GH}$ is applied only to the write word line 208_n+2. Further, signals based on data to be written to the memory cells in the (n+2)th row are supplied to all the bit lines (including the bit lines 209_m and 209_m+1). By this operation, data is written to the memory cells in the (n+2)th row.

By such operation, data is written to all the memory cells. In the above example, data is written to the memory cells in all the rows; however, data may be written only to memory cells in a specific row or data is not written to memory cells in a specific row.

At the time of storing data, the potentials of all the write word lines 208 are set to $V_{GL}$ and the potentials of the bit lines 209 are set to $V_{DL}$.

At the time of reading data, the potential of the read line 211 is set to an appropriate positive potential (e.g., a power supply potential). In addition, the potentials of all the write word lines are set to $V_{GL}$. Then, for example, in order to read data from the memory cells in the n-th row, the potentials of the read word lines other than the read word line in the n-th row are set to potentials at which the element transistors are turned off regardless of data written. On the other hand, the potential of the read word line 207_n is set to a potential which is appropriate to read data.

Consequently, the element transistors 203P in columns of the n-th row are turned on or off in accordance with data written. Accordingly, the potentials of the bit lines 209 in the columns fluctuate, so that data can be determined by the output of the inverter 205.

In the above example, a memory cell including a p-channel element transistor is used; however, as illustrated in FIG. 1B, a memory cell including an n-channel element transistor can be similarly used.

Next, a method for determining whether the threshold voltage $V_{th}$ of the write transistor 201 in the memory cell 200N illustrated in FIG. 1B is within the allowable range with the use of the element transistor 203N is described. As illustrated in FIG. 4A, when the potential of the gate of the write transistor 201 is $V_{GM}$ and the potential of a drain of the write transistor 201 is $V_{DH}$ ($V_{DH} \geq V_{GM} > V_{th}$), the potential of the hold node D rises in accordance with accumulation of electrical charge in the capacitor 202 and is stabilized at ($V_{GM} - V_{th}$).

When the potential of the hold node D (i.e., the potential of the gate of the element transistor 203N) is higher than threshold voltage $V_{th\_N}$ of the element transistor 203N, the element transistor 203N is turned on (the output $V_{OUT}$ of the inverter 205 is H). When the potential of the hold node D is lower than or equal to the threshold voltage $V_{th\_N}$, the element transistor 203N is turned off (the output $V_{OUT}$ of the inverter 205 is L).

Figure 4B:
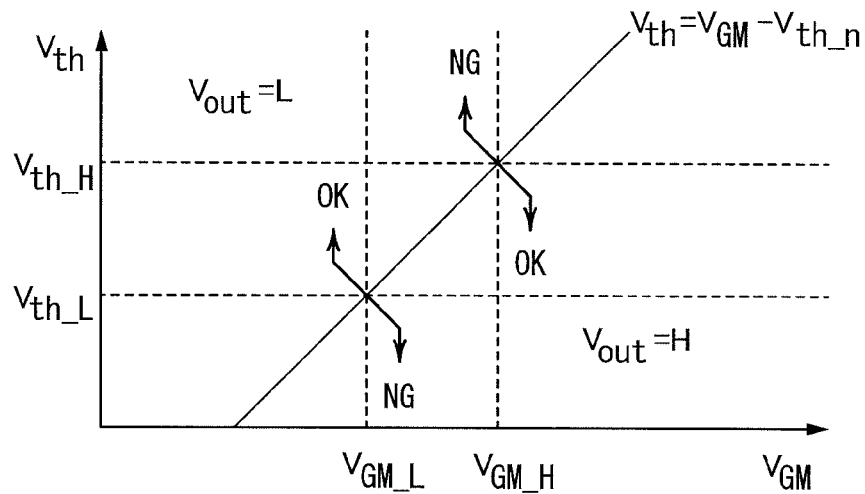

This is described with reference to FIG. 4B. In FIG. 4B, the horizontal axis indicates the potential $V_{GM}$ and the vertical axis indicates the threshold voltage $V_{th}$ of the write transistor 201. The output $V_{OUT}$ of the inverter 205 is H on the right side and the lower side of the straight line $V_{th} = V_{GM} - V_{th\_N}$, and the output $V_{OUT}$ of the inverter 205 is L on the left side and the upper side of the straight line $V_{th} = V_{GM} - V_{th\_N}$.

Thus, when the potential $V_{GM}$ is set appropriately, whether the threshold voltage $V_{th}$ of the write transistor 201 is within an appropriate range (the upper limit is $V_{th\_H}$ and the lower limit is $V_{th\_L}$) can be determined. That is, the following first and second verifications are performed.

In the first verification, whether the threshold voltage $V_{th}$ is lower than the upper limit of the range is determined under a condition of $V_{GM} = V_{GM\_H} = V_{th\_H} + V_{th\_N}$. When the output $V_{OUT}$ of the inverter 205 is H, the threshold voltage $V_{th}$ is lower than the upper limit $V_{th\_H}$. In the second verification, whether $V_{th}$ is higher than the lower limit of the range is determined under a condition of $V_{GM} = V_{GM\_L} = V_{th\_L} + V_{th\_N}$. When the output $V_{OUT}$ of the inverter 205 is L, the threshold voltage $V_{th}$ is higher than or equal to the lower limit $V_{th\_L}$.

In other words, when the output $V_{OUT}$ of the inverter 205 is H in the first verification and the output $V_{OUT}$ of the inverter 205 is L in the second verification, it can be said that the threshold voltage $V_{th}$ of the write transistor 201 is between $V_{th\_H}$ and $V_{th\_L}$. In other cases, the threshold voltage $V_{th}$ of the write transistor 201 is out of the allowable range.

As a result of these verifications, the memory cell 200N including the write transistor 201 whose threshold voltage $V_{th}$ is determined to be between $V_{th\_H}$ and $V_{th\_L}$ is treated as a good item. The memory cell 200N including the write transistor 201 whose threshold voltage $V_{th}$ is not determined to be between $V_{th\_H}$ and $V_{th\_L}$ has a problem with data retention characteristics; thus, such a memory cell is not used. It is preferable to replace the memory cell with an auxiliary memory cell.

A specific example is described below. In this example, the allowable range of the threshold voltage $V_{th}$ of the write transistor 201 is $+1.4 \leq V_{th} < +2.4$ [V]. Note that the allowable range of the threshold voltage can be set as appropriate by a practitioner regardless of the above range. The threshold voltage $V_{th\_N}$ of the element transistor 203N is +0.5 V. Note that the potential of the hold node D is set to 0 V before the following verification is performed.

In the first verification, the potential $V_{GM}$ is set to +2.9 V (= $V_{th\_H} + V_{th\_N}$). The potential $V_{DH}$ may be higher than or equal to the potential $V_{GM}$. The potential of the hold node D is stabilized at (2.9 - $V_{th}$) [V] when $V_{th} < +2.9$ [V] or is 0 V when $V_{th} \geq +2.9$ [V]. In that case, when the element transistor 203N is on (the output $V_{OUT}$ of the inverter 205 is H), the potential of the hold node D is higher than the threshold voltage $V_{th\_N}$ of the element transistor 203N. When the element transistor 203N is off (the output $V_{OUT}$ of the inverter 205 is L), the potential of the hold node D is lower than or equal to the threshold voltage $V_{th\_N}$ of the element transistor 203N.

The threshold voltage $V_{th\_N}$ of the element transistor 203N is +0.5 V. Thus, the threshold voltage $V_{th}$ is lower than +2.4 V when the element transistor 203N is on, and the threshold voltage $V_{th}$ is higher than or equal to +2.4 V when the element transistor 203N is off. Thus, in the case where the element transistor 203N is turned off (the output $V_{OUT}$ of the inverter 205 is L), the threshold voltage $V_{th}$ of the write transistor in the memory cell 200N is out of the allowable range. Accordingly, the memory cell 200N is, for example, replaced with an auxiliary memory cell so as not to be used. Through the above steps, the first verification is completed. After that, the potential of the hold node D is set to 0 V.

Next, in the second verification, the potential $V_{GM}$ is set to +1.9 V (= $V_{th\_L} + V_{th\_N}$). The potential $V_{DH}$ may be higher than or equal to the potential $V_{GM}$. Then, the potential of the hold node D is (1.9 - $V_{th}$) [V] when $V_{th} < +1.9$ [V] or is 0 V when $V_{th} \geq +1.9$ [V]. In that case, when the element transistor 203N is on (the output $V_{OUT}$ of the inverter 205 is H), the potential of the hold node D is higher than the threshold voltage $V_{th\_N}$ of the element transistor 203N. When the element transistor 203N is off (the output $V_{OUT}$ of the inverter 205 is L), the potential of the hold node D is lower than or equal to the threshold voltage $V_{th\_N}$ of the element transistor 203N.

The threshold voltage $V_{th}$ is lower than +1.4 V when the element transistor 203N is on, and the threshold voltage $V_{th}$ is higher than or equal to +1.4 V when the element transistor 203N is off. Thus, in the case where the element transistor 203N is turned on (the output $V_{OUT}$ of the inverter 205 is H), the threshold voltage $V_{th}$ of the write transistor in the memory cell 200N is out of the allowable range. Accordingly, the memory cell 200N is, for example, replaced with an auxiliary memory cell so as not to be used. Through the above steps, the second verification is completed.

Through the above verifications, it is possible to select memory cells in which the threshold voltages $V_{th}$ of the write transistors 201 are within the allowable range. Accordingly, it is possible to prevent a defect in which an adequate amount of electrical charge cannot be accumulated in the capacitor 202 because the threshold voltage $V_{th}$ of the write transistor 201 is too high and a defect in which electrical charge cannot be held for a required period because the threshold voltage $V_{th}$ is too low, so that reliability can be improved.

Similarly, whether the threshold voltage $V_{th}$ of the write transistor 201 in the memory cell 200P illustrated in FIG. 1C is within the allowable range with the use of the element transistor 203P can be determined. As illustrated in FIG. 5A, when the potential of the gate of the write transistor 201 is $V_{GM}$ and the potential of the drain of the write transistor 201 is $V_{DH}$ ($V_{DH} \geq V_{GM} > V_{th}$), the potential of the hold node D rises in accordance with accumulation of electrical charge in the capacitor 202 and is stabilized at ($V_{GM} - V_{th}$).

Then, when the potential of the hold node D (i.e., the potential of the gate of the element transistor 203P) is lower than ($V_{DD} + V_{th\_P}$), the element transistor 203P is turned on. Here, the threshold voltage of the element transistor 203P is denoted by $V_{th\_P}$. Thus, the level of the threshold voltage $V_{th}$ of the write transistor 201 can be known from the potential $V_{GM}$ and the threshold voltage $V_{th\_P}$ of the element transistor 203P.

For example, $V_{DD}$ is +2.0 V, the threshold voltage $V_{th\_P}$ of the element transistor 203P is −0.5 V, and the allowable range of the threshold voltage $V_{th}$ of the write transistor 201 is $+1.4 < V_{th} \leq 2.4$ [V]. The potential of the hold node D is initially set to 0 V.

Figure 5B:
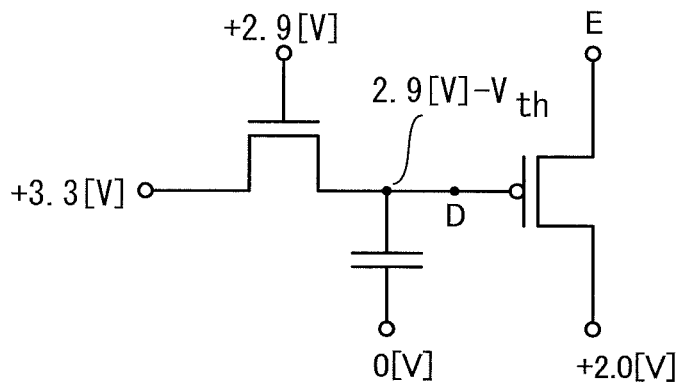

First, the potential $V_{GM}$ is set to +2.9 V. The potential $V_{DH}$ may be higher than or equal to the potential $V_{GM}$. Here, the potential $V_{DH}$ is +3.3 V. The potential of the hold node D is stabilized at $(2.9 - V_{th})$ [V] when $V_{th} < +2.9$ [V] or is stabilized at 0 V when $V_{th} \geq +2.9$ [V]. In that case, when the element transistor 203P is on, the potential of the hold node D is lower than $(2.0 + V_{th\_P})$ [V]. When the element transistor 203P is off, the potential of the hold node D is higher than or equal to $(2.0 + V_{th\_P})$ [V] (see FIG. 5B).

Thus, the threshold voltage $V_{th}$ is higher than +1.4 V when the element transistor 203P is on, and the threshold voltage $V_{th}$ is lower than or equal to +1.4 V when the element transistor 203P is off. In other words, in the case where the element transistor 203P is turned off (the output $V_{OUT}$ of the inverter 205 is H), the threshold voltage $V_{th}$ of the write transistor in the memory cell 200P is out of the allowable range. Accordingly, the memory cell 200P is, for example, replaced with an auxiliary memory cell so as not to be used.

Next, after the potential of the hold node D is set to 0 V, the potential $V_{GM}$ is set to +3.9 V. The potential $V_{DH}$ may be higher than or equal to the potential $V_{GM}$. Here, the potential $V_{DH}$ is +4.3 V, for example. The potential of the hold node D is stabilized at $(3.9 - V_{th})$ [V] when $V_{th} < +3.9$ [V] or is stabilized at 0 V when $V_{th} \geq +3.9$ [V].

Figure 5C:
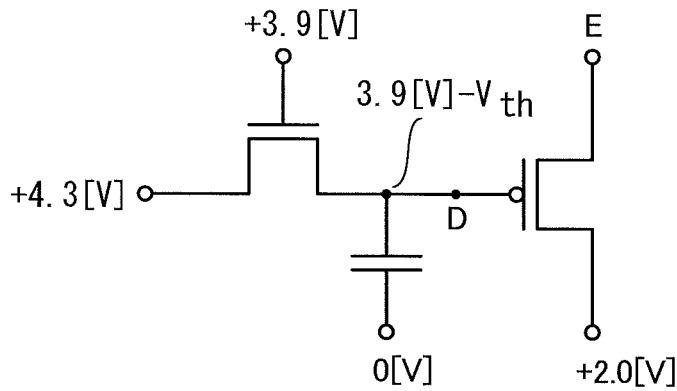

In that case, when the element transistor 203P is on, the potential of the hold node D is lower than $(2.0 + V_{th\_P})$ [V]. When the element transistor 203P is off, the potential of the hold node D is higher than or equal to $(2.0 + V_{th\_P})$ [V] (see FIG. 5C).

The threshold voltage $V_{th\_P}$ of the element transistor 203P is −0.5 V. Thus, the threshold voltage $V_{th}$ is higher than +2.4 V when the element transistor 203P is on, and the threshold voltage $V_{th}$ is lower than or equal to +2.4 V when the element transistor 203P is off. Thus, in the case where the element transistor 203P is turned on (the output $V_{OUT}$ of the inverter 205 is L), the threshold voltage $V_{th}$ of the write transistor in the memory cell 200P is out of the allowable range. Accordingly, the memory cell 200P is, for example, replaced with an auxiliary memory cell so as not to be used.

The above method is a method for determining whether the threshold voltages of the write transistors 201 in the memory cells are within the allowable range; however, the method can be similarly applied to a matrix semiconductor memory device as illustrated in FIG. 7.

First, through initial inspection, memory cells where the write transistors 201 operate normally are recorded. The threshold voltages of the write transistors 201 in these memory cells are certainly higher than or equal to 0 V; however, the detailed levels of the threshold voltages are not clear. Thus, whether the memory cells have adequate capability of data retention is not clear.

Next, for example, inspection of the threshold voltages of the write transistors 201 in the (n+1)th row may be performed as follows. First, the potentials of all the write word lines except the write word line 208_n+1 are set to $V_{GL}$ and the write transistors 201 in the rows are turned off. On the other hand, the potential of the write word line 208_n+1 is set to the potential $V_{GM}$ used in verification and the potentials of all the bit lines are set to $V_{DH}$ ($\geq V_{GM}$), so that electrical charge is accumulated in the capacitors 202. These values may be the values shown in FIGS. 5A to 5C.

After that, the potential of the write word line 208_n+1 is set to $V_{GL}$ and the potentials of all the bit lines are set to $V_{DL}$. Then, all the write transistors are turned off. On the other hand, the potentials of all the read word lines except the read word line 207_n+1 are set to potentials at which the element transistors 203P are turned off regardless of data, and the potential of the read word line 207_n+1 is set to a potential for reading data. In this state, signals output from the inverters 205 in columns are read.

Since the state of the element transistor 203P is changed in accordance with the threshold voltage of the write transistor 201 as described above, whether the threshold voltage of the write transistor 201 is within the allowable range can be inspected by verification of the output of the inverter 205.

In addition, this embodiment may be combined with the verification operation described in Embodiment 1. For example, whether the threshold voltage $V_{th}$ of the transistor 101 is within the allowable range can be determined in a combination of the first verification operation in Embodiment 1 and the second verification operation in this embodiment. Similarly, the second verification operation in Embodiment 1 may be combined with the first verification operation in this embodiment.

Note that as pointed out in Embodiment 1, the potential $V_{GM}$ may be introduced into the word line 208 from the outside. In the case where a potential which has the same level as $V_{GM}$ is employed as $V_{DH}$, the potential $V_{GM}$ introduced from the outside may also be introduced into the bit line.

Embodiment 3

Figure 8:
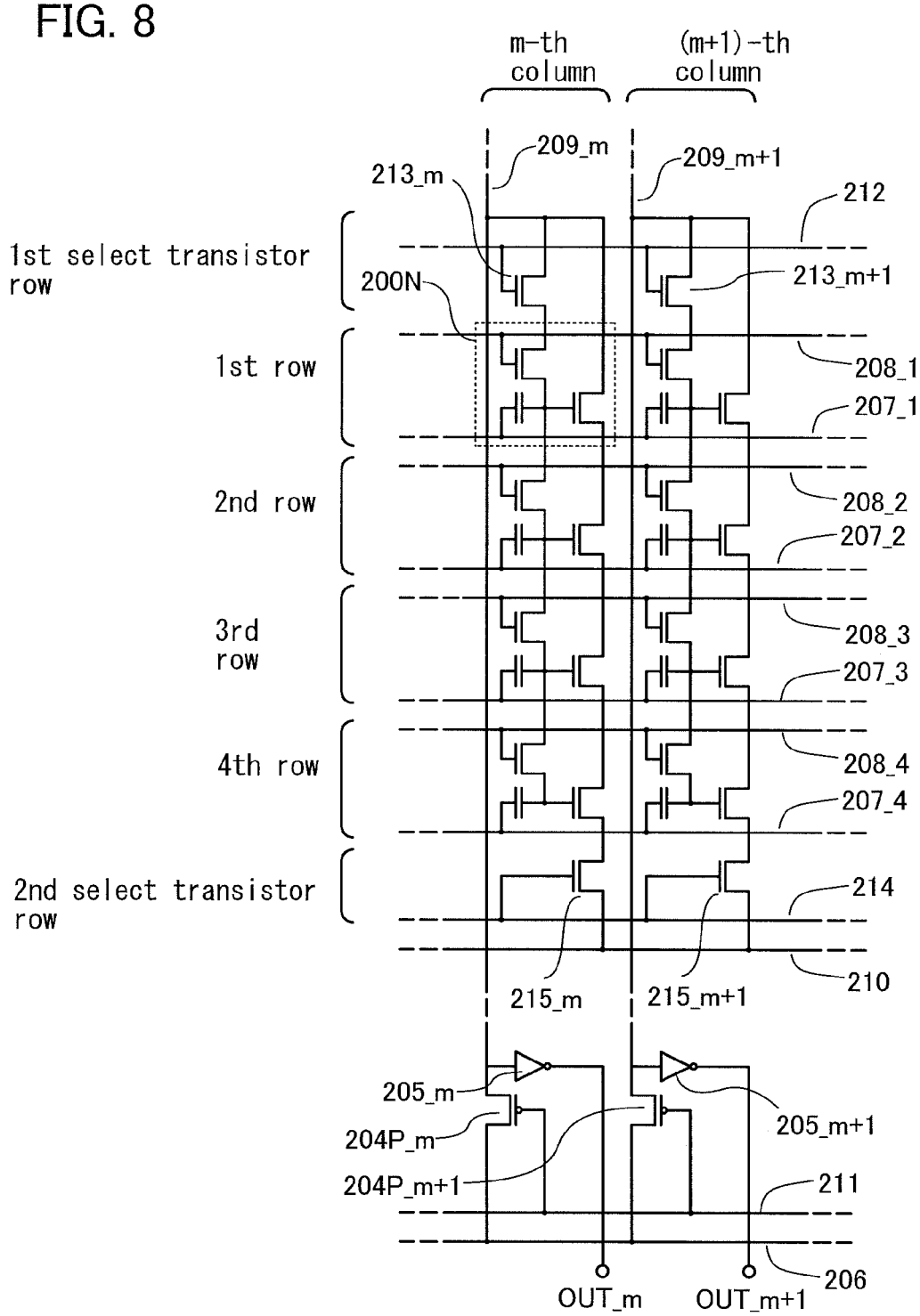
FIG. 8 illustrates an example of a semiconductor memory device.

An example of a NAND semiconductor memory device is described with reference to FIG. 8. FIG. 8 illustrates part of a NAND semiconductor memory device that corresponds to eight memory cells in a first row and an m-th column to a fourth row and an (m+1)th column (m is a natural number). The memory cells used are the same as the memory cell illustrated in FIG. 1B. Each memory cell includes a write transistor, a capacitor, and an n-channel element transistor, and FIG. 1B may be referred to for the details of these components.

Since the semiconductor memory device in this embodiment is a NAND type, it has a circuit structure that is different from the circuit structure of the semiconductor memory device illustrated in FIG. 7. In one column, write transistors in the first to fourth rows are connected in series, and element transistors in the first to fourth rows are connected in series.

Further, first selection transistors 213_m and 213_m+1 are provided between the write transistors in the first row and the bit lines 209_m and 209_m+1 so as to be connected in series, respectively, and second selection transistors 215_m and 215_m+1 are provided between the element transistors in the fourth row and a source line 210 so as to be connected in series.

Gates of the first selection transistors 213_m and 213_m+1 are connected to a first selection line 212. Gates of the second selection transistors 215_m and 215_m+1 are connected to a second selection line 214. Gates of the write transistors in the memory cells are connected to write word lines 208_1, 208_2, 208_3, and 208_4.

Note that it is effective in improving the integration degree to provide the source line 210 in parallel with the write word lines as illustrated in FIG. 8; however, the source line 210 may be provided in parallel with the bit lines. In addition, the source line 210 may be constantly set to a fixed potential. In the following description, the source line 210 is constantly set to 0 V. Further, the potential of a wiring 206 that is connected to sources of read transistors 204P_m and 204P_m+1 is constantly set to an appropriate positive potential (e.g., a power supply potential). In this embodiment, the transistor 204P used for reading data and the inverter 205 are similar to those illustrated in FIG. 4A.

An example of data writing is described below. First, the potentials of the read word lines 207_1, 207_2, 207_3, and 207_4 are set to 0 V. In addition, the potentials of the write word lines 208_1, 208_2, 208_3, and 208_4 are set to the potential $V_{GH}$. Accordingly, the write transistors in the memory cells illustrated in FIG. 8 are turned on.

The second selection line 214 is set to 0 V and the potential of the read line 211 is set to an appropriate positive potential so that the second selection transistors 215_m and 215_m+1 and the read transistors 204P_m and 204P_m+1 are turned off. In addition, an appropriate positive potential is applied to the first selection line 212 so that the first selection transistors 213_m and 213_m+1 are turned on.

In this state, signals based on data to be written to the memory cells in the fourth row are supplied to the bit lines 209_m and 209_m+1. The signal may be either a binary signal or a multivalued signal. By this operation, data is written to the memory cells in the first to fourth rows. Then, the potential $V_{GL}$ is applied to the write word line 208_4 in the fourth row so that the write transistors in the fourth row are turned off. Consequently, data is stored in the memory cells in the fourth row.

Further, signals based on data to be written to the memory cells in the third row are supplied to the bit lines 209_m and 209_m+1. By this operation, data is written to the memory cells in the first to third rows. Then, the potential $V_{GL}$ is applied to the write word line 208_3 in the third row so that the write transistors in the third row are turned off. Consequently, data is stored in the memory cells in the third row.

Similarly, signals based on data to be written to the memory cells in the second row are supplied to the bit lines 209_m and 209_m+1, and then signals based on data to be written to the memory cells in the first row are supplied to the bit lines 209_m and 209_m+1. Then, the potential $V_{GL}$ is applied to the write word lines in the rows so that the write transistors in the rows are turned off. Thus, data is stored in the memory cells in the first to fourth rows. Then, the first selection line 212 is set to 0 V so that the first selection transistors 213_m and 213_m+1 are turned off.

At the time of storing data, the potentials of all the write word lines 208 are set to $V_{GL}$, and the potentials of the bit lines 209 are set to $V_{DL}$.

Data reading is performed as follows. For example, the case where data is read from the memory cells in the third row is described. In that case, the potential of the read word line 207_3 is used as a potential for reading data. On the other hand, the other read word lines have potentials at which the element transistors are turned on regardless of data written. In addition, the potential of the second selection line 214 is set to an appropriate positive potential so that the second selection transistors 215_m and 215_m+1 are turned on. Further, in order to operate the read transistors 204P, the potential of the read line 211 is set to 0 V.

Then, the potentials of the bit lines 209 in the columns are changed depending on whether the element transistors in columns of the third row are on or off, so that data can be determined by the output of the inverter.

Inspection of the threshold voltage of the write transistor in the memory cell 200N used in such a semiconductor memory device is performed as follows.

First, through initial inspection, memory cells where write transistors operate normally are recorded. The threshold voltages of the write transistors in these memory cells are certainly higher than or equal to 0 V; however, the detailed levels of the threshold voltages are not clear. Thus, whether the memory cells have adequate capability of data retention is not clear.

Next, for example, the case where the threshold voltages of the write transistors in the memory cells in the third row are inspected is described. In that case, the potential of the write word line 208_4 is set to $V_{GL}$ and the potentials of the write word lines 208_1, 208_2, and 208_3 are set to the potential $V_{GM}$ used for inspection so that the write transistors in the first to third rows are turned on. In addition, the potential of the first selection line 212 is set to an appropriate positive potential so that the first selection transistors 213 are turned on. The potential $V_{GM}$ may be determined under the condition described in Embodiment 2.

In addition, the potential $V_{DH}$ ($V_{th} < V_{GM} \leq V_{DH}$, where $V_{th}$ indicates the threshold voltage of the write transistor) is applied to all the bit lines 209. Then, the potentials of sources of the write transistors in the columns of the third row (the potentials of gates of the element transistors) are set to ($V_{GM} - V_{DH}$).

After that, the potentials of the write word lines 208_1, 208_2, and 208_3 are set to $V_{GL}$ so that the write transistors in the first to third rows are turned off. In addition, the potential of the first selection line 212 is set to 0 V so that the first selection transistors 213 are turned off.

Next, an appropriate potential is applied to the second selection line so that the second selection transistors 215 are turned on. In addition, potentials at which the element transistors are turned on regardless of data written are applied to the read word lines 207_1, 207_2, and 207_4. On the other hand, a potential for reading data is applied to the read word line 207_3.

As described in Embodiment 2, the potential of the gate of the element transistor contains data on the threshold voltage $V_{th}$ of the write transistor, and the element transistor is on or off depending on the data on the threshold voltage $V_{th}$ of the write transistor. Thus, whether the threshold voltage is within the allowable range can be determined by the outputs of the inverters 205 connected to the bit lines. A memory cell in which the threshold voltage of the write transistor is determined to be out of the allowable range is preferably replaced with an auxiliary memory cell.

Embodiment 4

Although Embodiment 1 describes the example in which the potential of the transistor 101 is determined while the potential of the terminal A in FIG. 1A is set to a potential that is higher than or equal to the potential of the terminal B at the time of reading data, this embodiment describes an example in which the potential of the transistor 101 is determined while the potential of the terminal A is set to a potential that is lower than or equal to the potential of the terminal B.

In this embodiment, whether the threshold voltage of the transistor 101 is within the allowable range is determined by changing the potential of the terminal C after data is written. A specific example is described below with reference to FIG. 1A. In this example, the allowable range of the threshold voltage $V_{th}$ is +1.4<$V_{th}$+1.7 [V]. Note that the allowable range of the threshold voltage can be set as appropriate by a practitioner. The potential of the hold node D is initially set to 0 V.

First, in first verification operation, data is written while the potential of the terminal A is set to +2.1 V and the potential of the terminal B is set to +3.5 V. The potential of the terminal A may be different as long as it is higher than or equal to +1.8 V. Note that +1.8 V is (the potential of the terminal B)−(the upper limit of the threshold voltage). In that case, the potential of the hold node D is +2.1 V if the threshold voltage $V_{th}$ of the transistor 101 is lower than or equal to +1.4 V; the potential of the hold node D is (3.5−$V_{th}$) [V] when $V_{th}$<+3.5 [V] or is 0 V when $V_{th}$≥+3.5 [V] if the threshold voltage $V_{th}$ of the transistor 101 is higher than +1.4 V. After data is written, the potential of the terminal A is set to $V_{GL}$.

Next, the potential of the terminal C decreases by 0.8 V from the potential at the time of writing data. Then, the potential of the hold node D also decreases by 0.8 V and is +1.3 V when $V_{th}$≤+1.4 [V], (2.7−$V_{th}$) [V] when +1.4<$V_{th}$<+3.5 [V], or −0.8 V when $V_{th}$≥+3.5 [V].

Next, as illustrated in FIG. 3A, the terminal A is connected to the sense amplifier. The potential of the terminal A is set to +1 V and the reference potential of the sense amplifier is also set to +1 V. Then, the potential of the terminal B is set to +3.5 V so that the transistor 101 is turned on. The output of the sense amplifier is H when the potential of the hold node D is higher than or equal to +1 V before the transistor 101 is turned on, and the output of the sense amplifier is L when the potential of the hold node D is lower than +1 V before the transistor 101 is turned on.

Here, when the threshold voltage $V_{th}$ of the transistor 101 is higher than +1.7 V, the potential of the hold node D is lower than +1 V and the output of the sense amplifier is L. That is, when the output of the sense amplifier is L, the threshold voltage $V_{th}$ of the transistor 101 is higher than +1.7 V. Thus, a memory cell in which the output of the sense amplifier is L in the first verification operation is not used, preferably replaced with an auxiliary memory cell. Through the above steps, the first verification is completed. After that, the potential of the hold node D is set to 0 V.

Next, in second verification operation, data is written while the potential of the terminal A is set to +2.1 V and the potential of the terminal B is set to +3.5 V. Note that +2.1 V is (the potential of the terminal B)−(the lower limit of the threshold voltage). In that case, the potential of the hold node D is +2.1 V if the threshold voltage $V_{th}$ of the transistor 101 is lower than +1.4 V; the potential of the hold node D is (3.5−$V_{th}$) [V] when $V_{th}$<+3.5 [V] or is 0 V when $V_{th}$≥+3.5 [V] if the threshold voltage $V_{th}$ of the transistor 101 is higher than or equal to +1.4 V. After data is written, the potential of the terminal A is set to $V_{GL}$.

Next, the potential of the terminal C decreases by 1.1 V from the potential at the time of writing data. Then, the potential of the hold node D also decreases by 1.1 V and is +1.0 V when $V_{th}$<+1.4 [V], (2.4−$V_{th}$) [V] when +1.4≤$V_{th}$<+3.5 [V], or −1.1 V when $V_{th}$≥+3.5 [V].

Next, the terminal A is connected to the sense amplifier. The potential of the terminal A is set to +1 V and the reference potential of the sense amplifier is also set to +1 V. Then, the potential of the terminal B is set to +3.5 V so that the transistor 101 is turned on. The output of the sense amplifier is H when the potential of the hold node D is higher than or equal to +1 V before the transistor 101 is turned on, and the output of the sense amplifier is L when the potential of the hold node D is lower than +1 V before the transistor 101 is turned on.

Here, when the threshold voltage $V_{th}$ of the transistor 101 is lower than or equal to +1.4 V, the potential of the hold node D is +1 V and the output of the sense amplifier is H. That is, when the output of the sense amplifier is H, the threshold voltage $V_{th}$ of the transistor 101 is lower than or equal to +1.4 V. Thus, a memory cell in which the output of the sense amplifier is L in the first verification operation is not used, preferably replaced with an auxiliary memory cell. Through the above steps, the second verification is completed.

Through the above verifications, it is possible to select memory cells in which the threshold voltages $V_{th}$ of the transistors 101 are within the allowable range. Accordingly, it is possible to prevent a defect in which an adequate amount of electrical charge cannot be accumulated in the capacitor 102 because the threshold voltage $V_{th}$ of the transistor 101 is too high and a defect in which electrical charge cannot be held for a required period because the threshold voltage $V_{th}$ is too low, so that reliability can be improved. The above method can be applied to a semiconductor memory device where the memory cells 100 are arranged in matrix (e.g., the semiconductor devices illustrated in FIG. 6, FIG. 7, and FIG. 8).

In the above verification operations, the potential of the hold node D is determined using the sense amplifier. However, the potential of the hold node D can be determined from the state of the element transistor as described in Embodiment 2 as long as the gate of the element transistor 203N or 203P is connected to the hold node D in the memory cell as in the memory cell 200N in FIG. 1B or the memory cell 200P in FIG. 1C.

In addition, this embodiment may be combined with the verification operation described in Embodiment 1. For example, whether the threshold voltage $V_{th}$ of the transistor 101 is within the allowable range can be determined in a combination of the first verification operation in Embodiment 1 and the second verification operation in this embodiment. Similarly, the second verification operation in Embodiment 1 may be combined with the first verification operation in this embodiment. Similarly, this embodiment can be combined with Embodiment 2.

Note that although a potential applied to the terminal C is changed in this embodiment, such a potential is not used in normal operation in some cases. It is no use providing a potential generation circuit for such a potential in the semiconductor memory device. In addition, it is necessary that the accuracy of the potential be 60 mV or less, preferably 10 mV or less. For the above reasons, the potential applied to the terminal C may be introduced from the outside. Similarly, a potential applied to the terminal A may be introduced from the outside.

Embodiment 5

In this embodiment, the case where the semiconductor device described in the above embodiment is applied to an electronic device is described with reference to FIGS. 10A to 10D. In this embodiment, the case where the semiconductor device is applied to an electronic device such as a computer, electronic paper, a television set (also referred to as a television or a television receiver), or a memory card is described.

Figure 10A:
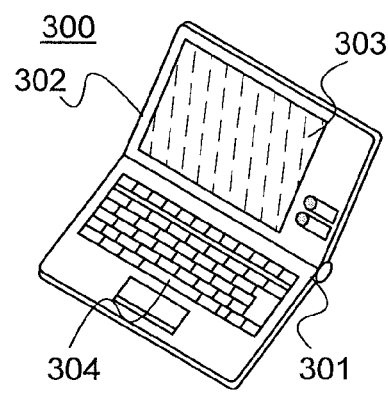
FIGS. 10A to 10D each illustrate an example of an electronic device including a semiconductor memory device.

FIG. 10A illustrates a laptop 300 that includes a housing 301, a housing 302, a display portion 303, a keyboard 304, and the like. At least one of the housings 301 and 302 may be provided with a highly-reliable semiconductor device inspected by the method described in the above embodiment. Thus, a laptop in which data can be retained for a long period and power consumption is sufficiently reduced is obtained.

Figure 10B:
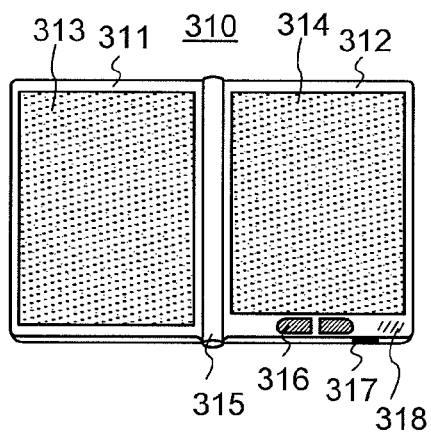

FIG. 10B illustrates an e-book reader 310 including electronic paper. The e-book reader 310 includes two housings 311 and 312. The housing 311 and the housing 312 include a display portion 313 and a display portion 314, respectively. The housings 311 and 312 are connected to each other by a hinge 315, so that the e-book reader 310 can be opened and closed using the hinge 315 as an axis. The housing 311 includes operation keys 316, a power button 317, a speaker 318, and the like. At least one of the housings 311 and 312 may be provided with a highly-reliable semiconductor device inspected by the method described in the above embodiment. Thus, an e-book reader in which data can be retained for a long period and power consumption is sufficiently reduced is obtained.

Figure 10C:
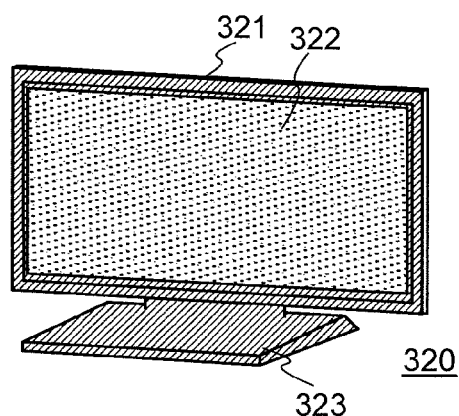

FIG. 10C illustrates a television set 320 that includes a housing 321, a display portion 322, a stand 323, and the like. For example, in order to record images or sounds, the housing 321 can be provided with a highly-reliable semiconductor device inspected by the method described in the above embodiment. Thus, a television set in which data can be retained for a long period and power consumption is sufficiently reduced is obtained.

Figure 10D:
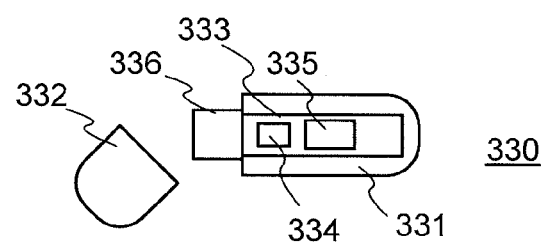

FIG. 10D illustrates a memory card having a USB connector (commonly also called a USB memory, a USB stick, a pen drive, or the like) 330. This memory card includes a main housing 331 and a cap 332. The housing 331 includes a substrate 333 and a USB connector 336. The substrate 333 is provided with a highly-reliable semiconductor memory device 335 inspected by the method described in the above embodiment and a control circuit 334. The control circuit 334 is used when data is transmitted and received while the memory card 330 is inserted into an electronic device.

As described above, the memory device in the above embodiment is mounted on the electronic device described in this embodiment. Thus, a highly-reliable electronic device in which data can be retained for a long period and power consumption is reduced is obtained. Needless to say, a similar effect is obtained when an electronic device other than those illustrated in FIGS. 10A to 10D includes the semiconductor device according to the above embodiment.

This application is based on Japanese Patent Application serial No. 2010-212179 filed with Japan Patent Office on Sep. 22, 2010, the entire contents of which are hereby incorporated by reference.

What is claimed is:

1. A method for inspecting a semiconductor memory device comprising a memory cell including a capacitor and a transistor, one of a source and a drain of the transistor being connected to the capacitor, and the transistor including an oxide semiconductor, the method comprising the steps of:
   a first step of turning on the transistor to accumulate electrical charge in the capacitor;
   a second step of turning off the transistor and setting the other of the source and the drain of the transistor to a floating state after the first step; and
   a third step of applying a voltage to a gate of the transistor and measuring a potential of the other of the source and the drain of the transistor to inspect a threshold voltage of the transistor after the second step.

2. The method for inspecting a semiconductor memory device, according to claim 1, wherein the transistor is an n-channel transistor.

3. The method for inspecting a semiconductor memory device, according to claim 2, wherein the other of the source and the drain of the transistor and the gate of the transistor are connected to a bit line and a word line, respectively.

4. The method for inspecting a semiconductor memory device, according to claim 1,
   wherein the memory cell further includes a second transistor, and
   wherein the one of the source and the drain of the transistor is connected to a gate of the second transistor.

5. The method for inspecting a semiconductor memory device, according to claim 4, wherein the second transistor includes a single crystal semiconductor.

6. The method for inspecting a semiconductor memory device, according to claim 1, wherein the oxide semiconductor includes at least one of indium, gallium, and zinc.

7. The method for inspecting a semiconductor memory device, according to claim 1, further comprising an auxiliary memory cell,
   wherein the auxiliary memory cell is used for the memory cell including the transistor whose threshold voltage is not within a predetermined range.

8. The method for inspecting a semiconductor memory device, according to claim 1, further comprising a sense amplifier,
   wherein a first input terminal of the sense amplifier is connected to the other of the source and the drain of the transistor.

9. A method for inspecting a semiconductor memory device comprising a memory cell including a capacitor and a transistor, one of a source and a drain of the transistor being connected to the capacitor, the method comprising the steps of:
   turning on the transistor to accumulate electrical charge in the capacitor;
   turning off the transistors;
   applying a first voltage to a gate of the transistor and measuring a potential of the other of the source and the drain of the transistor to inspect whether a threshold voltage of the transistor is higher than a lower limit of a predetermined range; and
   applying a second voltage to the gate of the transistor and measuring the potential of the other of the source and the drain of the transistor to inspect whether the threshold voltage of the transistor is lower than a higher limit of the predetermined range,
   wherein the first voltage is lower than the second voltage.

10. The method for inspecting a semiconductor memory device, according to claim 9, wherein the transistor is an n-channel transistor.

11. The method for inspecting a semiconductor memory device, according to claim 10, wherein the other of the source and the drain of the transistor and the gate of the transistor are connected to a bit line and a word line, respectively.

12. The method for inspecting a semiconductor memory device, according to claim 9,
   wherein the memory cell further includes a second transistor, and
   wherein the one of the source and the drain of the transistor is connected to a gate of the second transistor.

13. The method for inspecting a semiconductor memory device, according to claim 12, wherein the second transistor includes a single crystal semiconductor.

14. The method for inspecting a semiconductor memory device, according to claim 9, wherein the transistor includes an oxide semiconductor.

15. The method for inspecting a semiconductor memory device, according to claim 9, further comprising an auxiliary memory cell,
    wherein the auxiliary memory cell is used for the memory cell including the transistor whose threshold voltage is not within the predetermined range.

16. The method for inspecting a semiconductor memory device, according to claim 9, further comprising a sense amplifier,
    wherein a first input terminal of the sense amplifier is connected to the other of the source and the drain of the transistor.

17. A semiconductor memory device comprising:
    a memory cell comprising a capacitor and a transistor;
    a switch connected to a gate of the transistor through a word line; and
    a pad operationally connected to the switch,
    wherein one of a source and a drain of the transistor is connected to the capacitor,
    wherein the transistor includes an oxide semiconductor, and
    wherein the switch is configured to transmit at least two potentials to the gate of the transistor through the word line.

18. The semiconductor memory device according to claim 17, wherein the other of the source and the drain of the transistor is connected to a bit line.

19. The semiconductor memory device according to claim 17,
    wherein the memory cell further includes a second transistor, and
    wherein the one of the source and the drain of the transistor is connected to a gate of the second transistor.

20. The semiconductor memory device according to claim 19, wherein the second transistor includes a single crystal semiconductor.

21. The semiconductor memory device according to claim 17, wherein the oxide semiconductor includes at least one of indium, gallium, and zinc.

* * * * *

UNITED STATES PATENT AND TRADEMARK OFFICE
CERTIFICATE OF CORRECTION

PATENT NO.         : 8,767,443 B2                                    Page 1 of 1
APPLICATION NO.    : 13/235967
DATED              : July 1, 2014
INVENTOR(S)        : Toshihiko Saito It is certified that error appears in the above-identified patent and that said Letters Patent is hereby corrected as shown below:

In the Specification

Column 12, line 10, after "voltages" replace "$V_h$" with --$V_{th}$--; and

In the Claims

Column 26, line 43, in claim 9 replace "transistors" with --transistor--.

Signed and Sealed this
Twenty-fourth Day of February, 2015

Michelle K. Lee
*Deputy Director of the United States Patent and Trademark Office*